(12) United States Patent
Hayasaki et al.

(10) Patent No.: US 6,187,488 B1
(45) Date of Patent: Feb. 13, 2001

(54) PATTERN ESTIMATING METHOD AND PATTERN FORMING METHOD

(75) Inventors: Kei Hayasaki, Kamakura; Shinichi Ito, Yokohama; Fumio Komatsu, deceased, late of Fuchu, all of (JP), by Tomoko Komatsu, heir

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/527,526

(22) Filed: Mar. 16, 2000

(30) Foreign Application Priority Data

Mar. 18, 1999 (JP) .................................................. 11-074046
Sep. 27, 1999 (JP) .................................................. 11-273212

(51) Int. Cl.$^7$ ....................................................... G03F 9/00
(52) U.S. Cl. ............................................. 430/30; 430/311
(58) Field of Search ....................................... 430/30, 311

(56) References Cited

FOREIGN PATENT DOCUMENTS 2-30112    1/1990   (JP) .
9-152716   6/1997   (JP) .

*Primary Examiner*—Christopher G. Young
(74) *Attorney, Agent, or Firm*—Finnegan, Henderson, Farabow, Garrett & Dunner, L.L.P.

(57) ABSTRACT

A pattern estimating method, wherein during exposure for forming the device pattern, a latent image of a monitor pattern which has the same pitch as an L/S pattern as the device pattern and has a narrower line width than the L/S pattern is formed in a mark area, after developing the device pattern, probing light is applied from a monitor head to the monitor pattern, and under the conditions for preventing generation of diffracted light of first-order or more, the intensity of zero-order light reflected from the monitor pattern is detected, so that the size of the device pattern is estimated on the basis of the prestored relationship between the device pattern size and the zero-order diffracted light intensity.

20 Claims, 31 Drawing Sheets

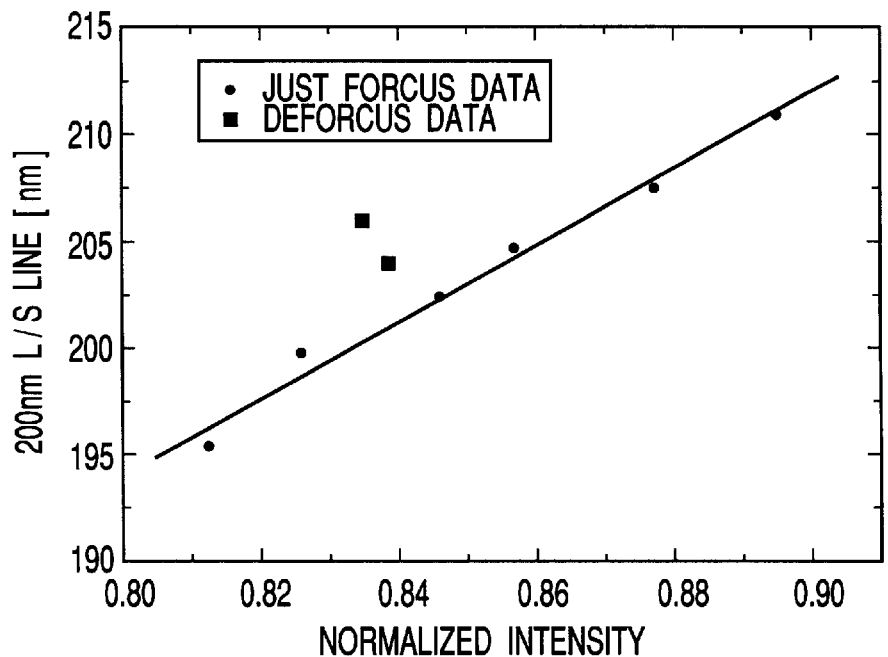
F I G. 4
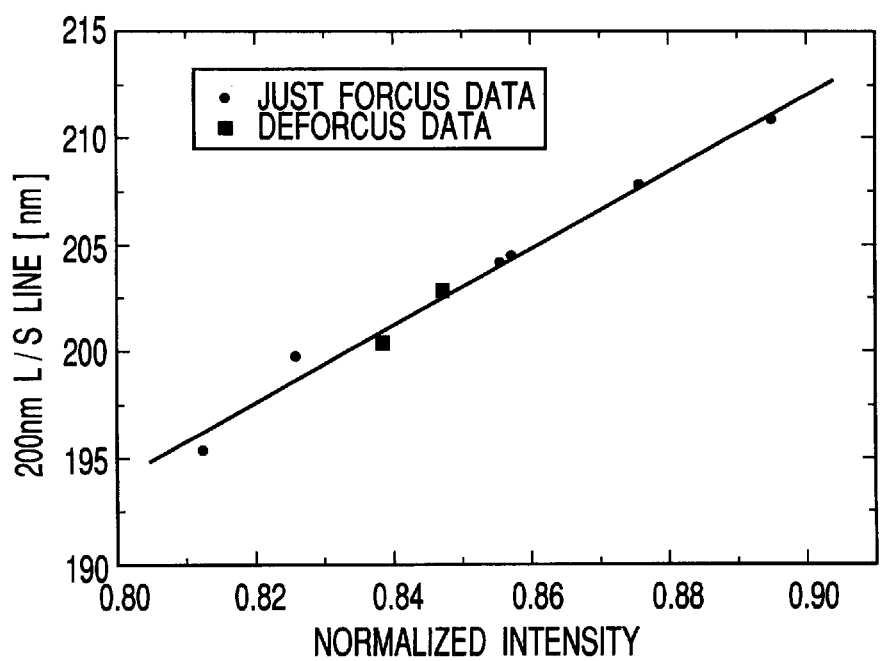
F I G. 5

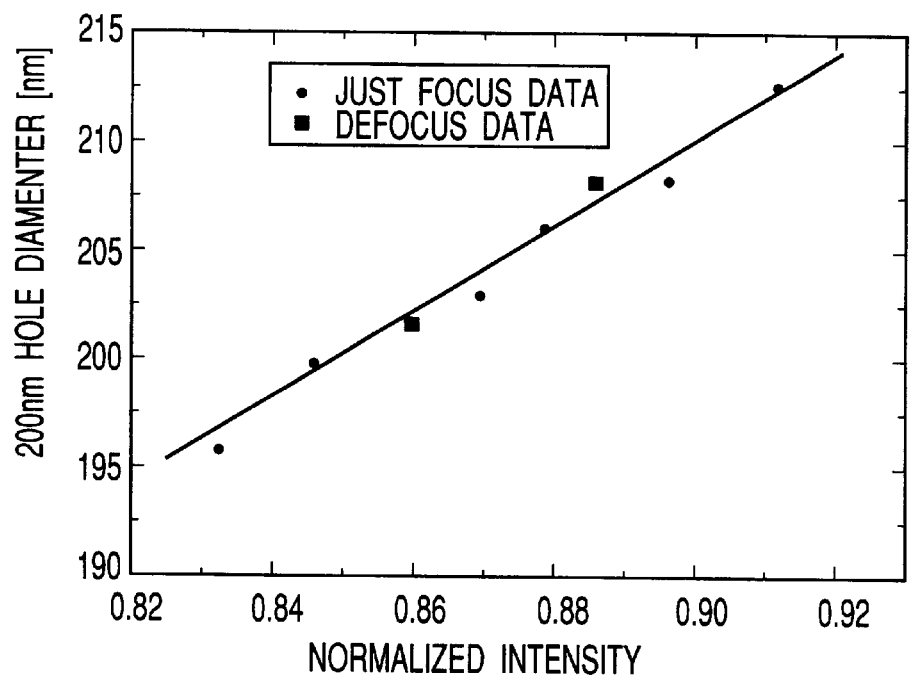
F I G. 15
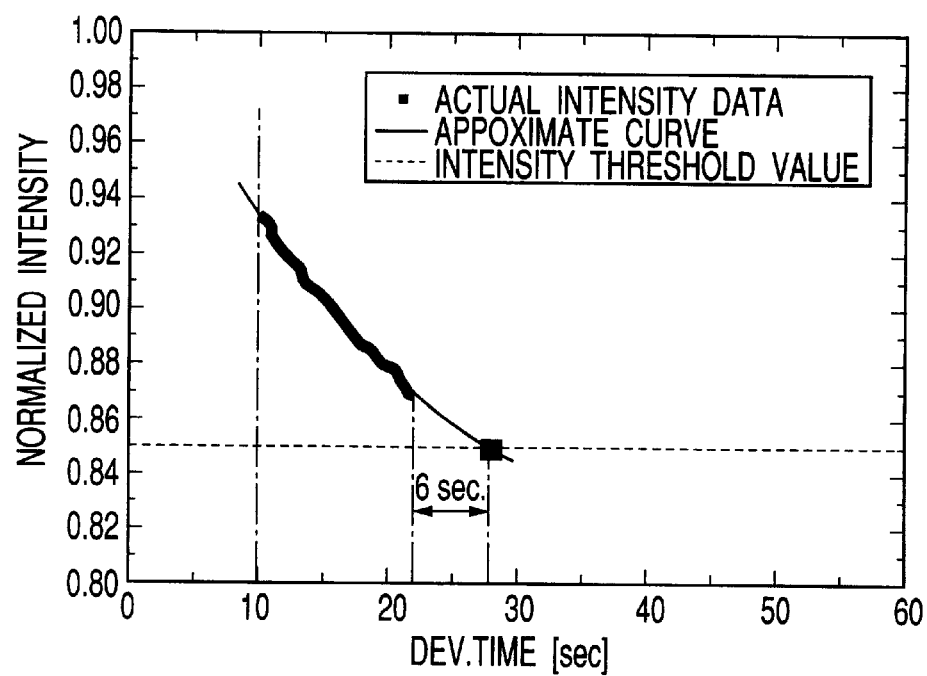
F I G. 16

| CHIP NO. | NORMALIZED INTENSITY |
|---|---|
| 1 | 2.06 |
| 2 | 2.02 |
| 3 | 2.08 |
| 4 | 2.06 |
| 5 | 2.06 |
| 6 | 2.09 |
| 7 | 2.06 |
| 8 | 2.05 |
| 9 | 2.06 |

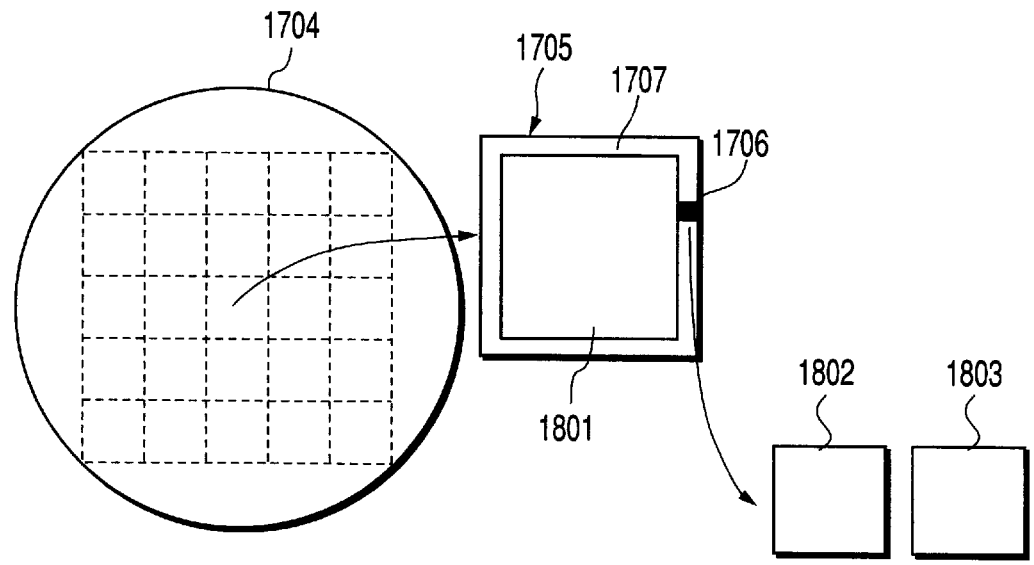
F I G. 34
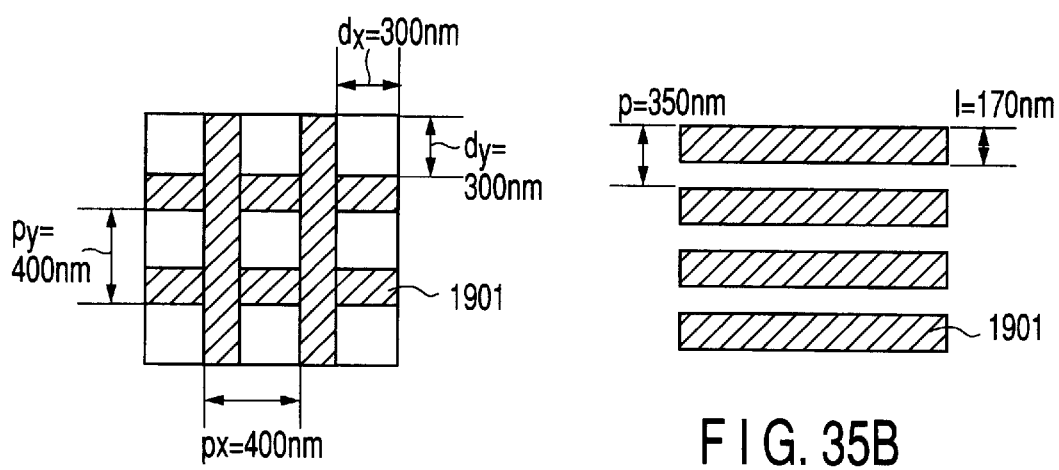
F I G. 35A
F I G. 35B

| CHIP NO. | NORMALIZED INTENSITY |
|---|---|
| 1 | 2.06 |
| 2 | 2.08 |
| 3 | 2.1 |
| 4 | 2.06 |
| 5 | 2.05 |
| 6 | 2.09 |
| 7 | 2.09 |
| 8 | 2.08 |
| 9 | 2.08 |
F I G. 37
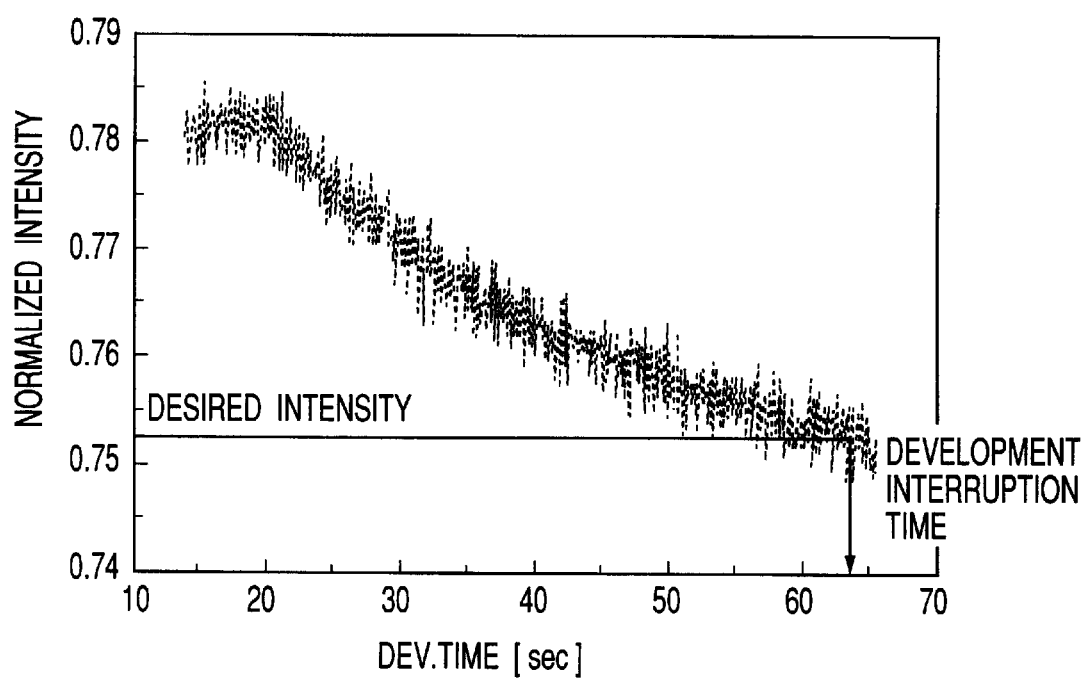
F I G. 38

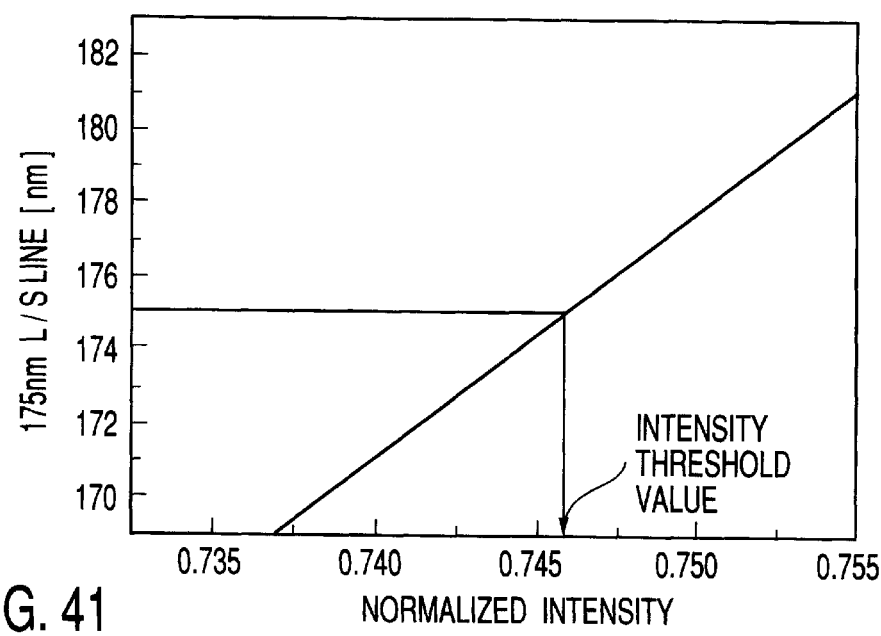
F I G. 41
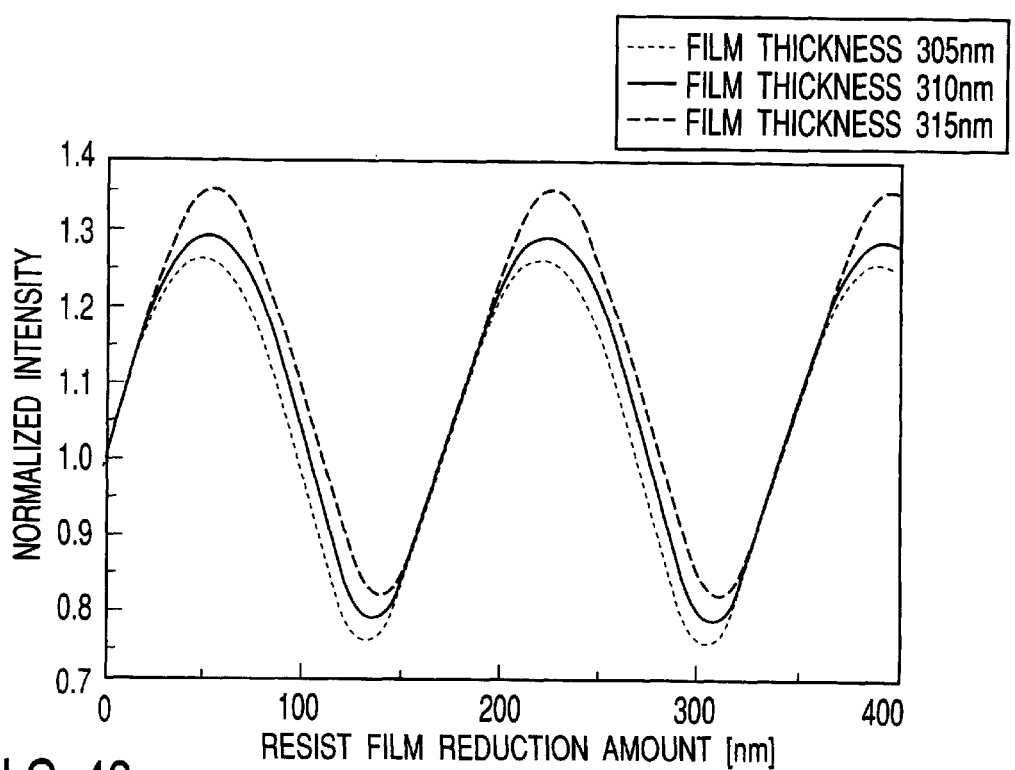
F I G. 42

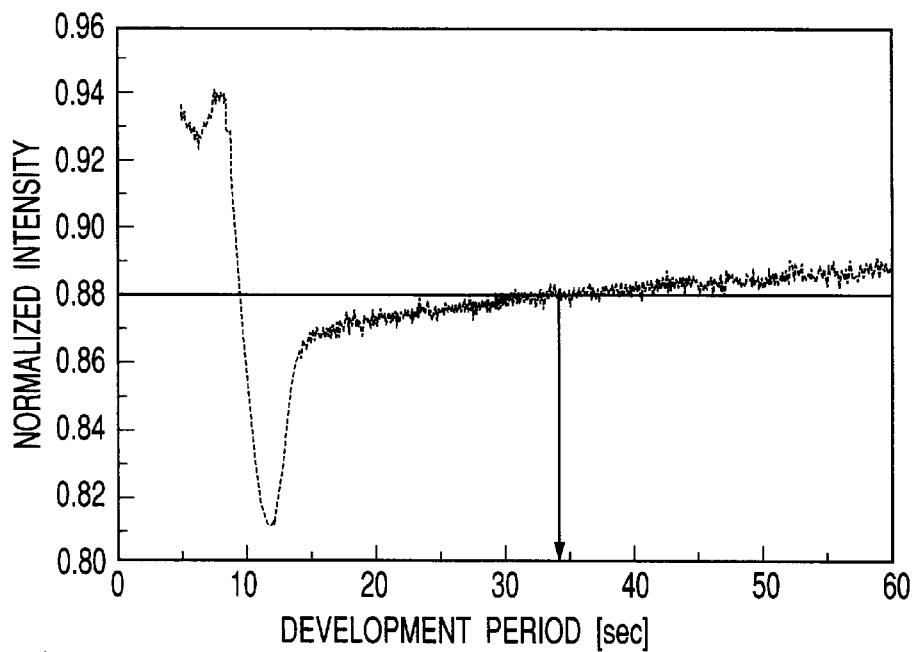
F I G. 47
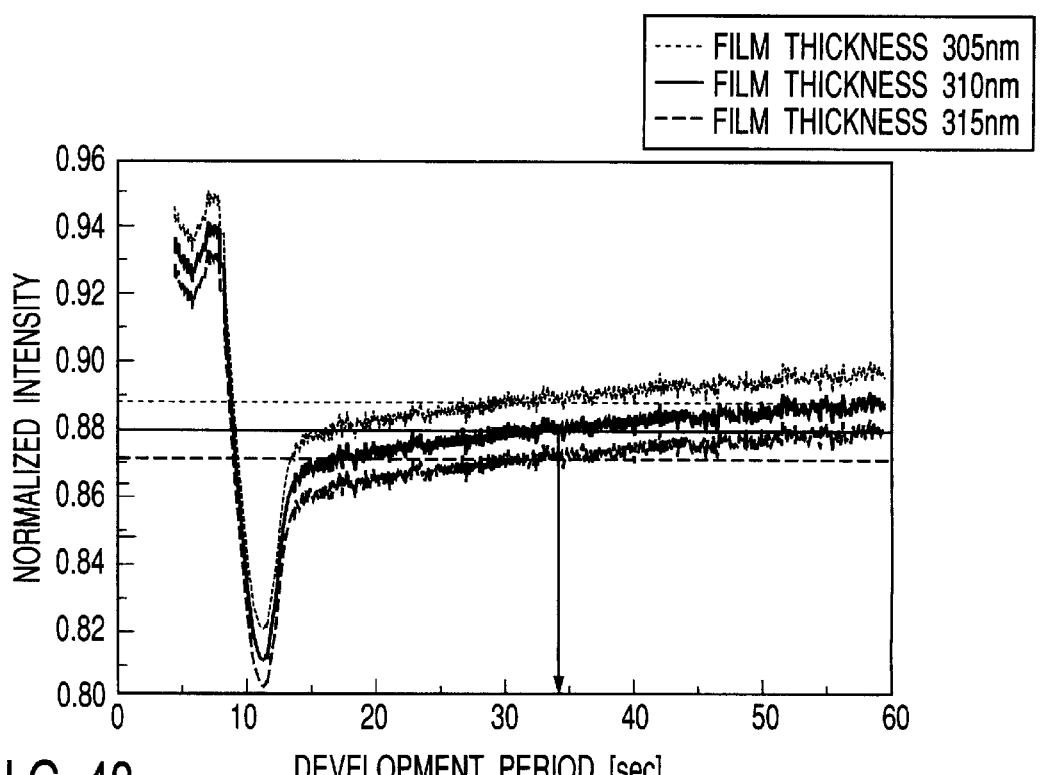
F I G. 48

| CHIP NO. | LATENT IMAGE FILM THICKNESS |
|---|---|
| 1 | 11.5 |
| 2 | 11.5 |
| 3 | 11.8 |
| 4 | 11.3 |
| 5 | 11.5 |
| 6 | 11.4 |
| 7 | 11.6 |
| 8 | 11.2 |
| 9 | 11.5 |
| AVERAGE | 11.47777778 |

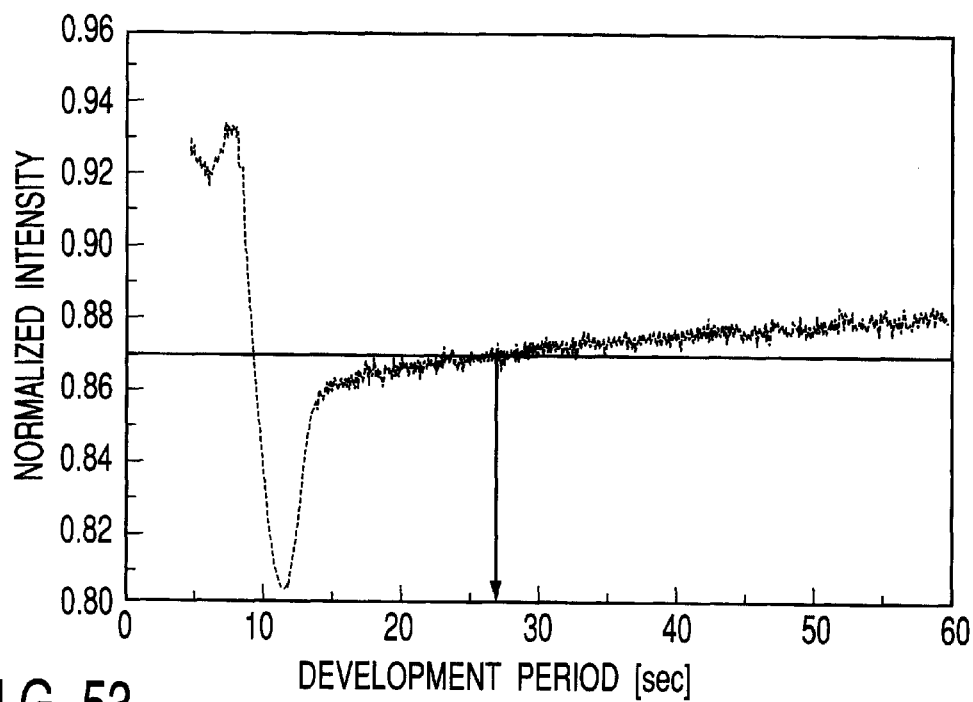
F I G. 53
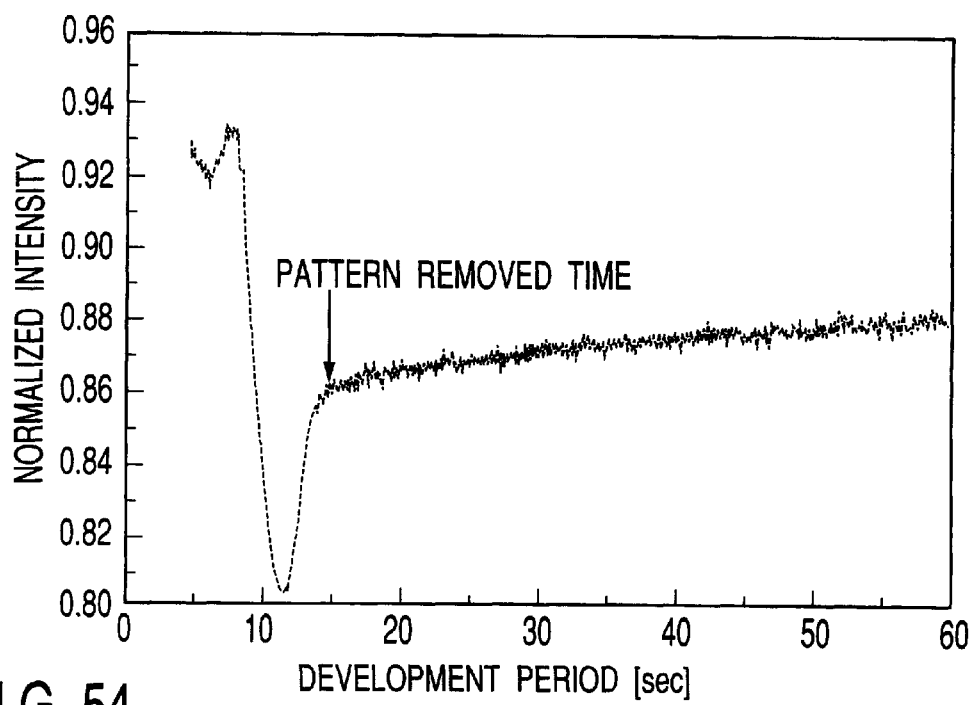
F I G. 54

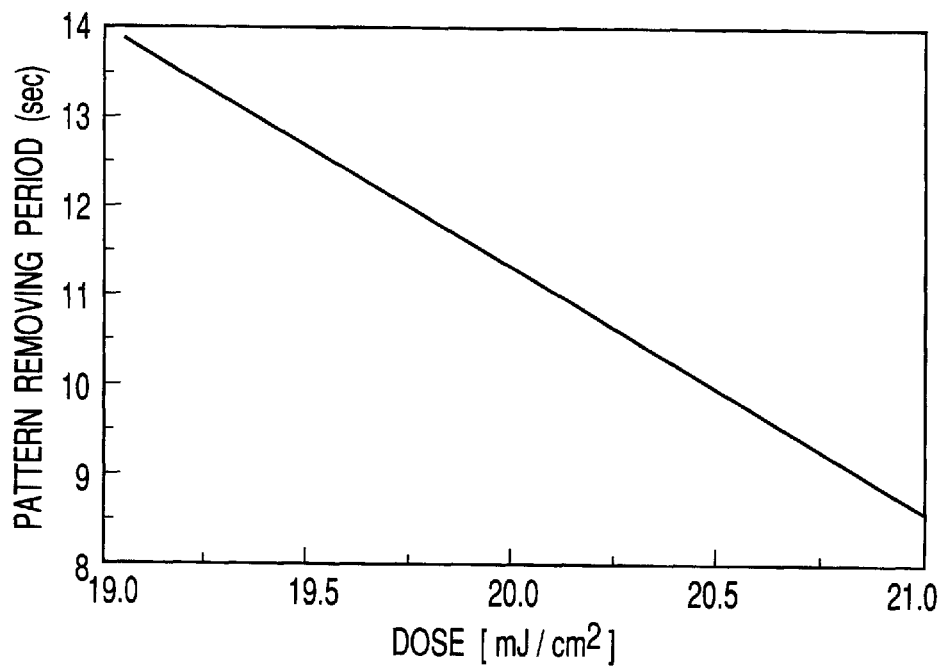
F I G. 55
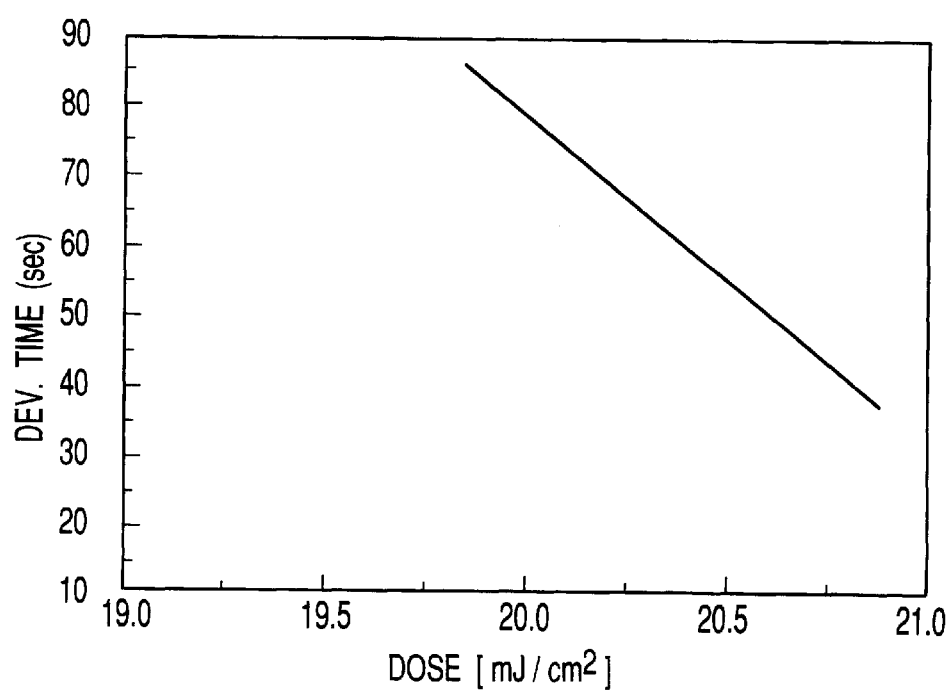
F I G. 56

| CHIP NO. | LATENT IMAGE FILM THICKNESS |
|---|---|
| 1 | 11.4 |
| 2 | 11.5 |
| 3 | 11.8 |
| 4 | 11.3 |
| 5 | 11.5 |
| 6 | 11.3 |
| 7 | 11.2 |
| 8 | 11.2 |
| 9 | 11.5 |
| AVERAGE | 11.41111111 |

PATTERN ESTIMATING METHOD AND PATTERN FORMING METHOD

CROSS-REFERENCE TO RELATED APPLICATIONS

This application is based upon and claims the benefit of priority from the prior Japanese Patent Applications No. 11-074046, filed Mar. 18, 1999; and No. 11-273212, filed Sep. 27, 1999, the entire contents of which are incorporated herein by reference.

BACKGROUND OF THE INVENTION

This invention relates to a pattern estimation method for measuring the size of a resist pattern during optical lithography employed in the manufacture of a semiconductor device. It also relates to a pattern forming method for determining a development interrupting period for forming the resist pattern.

In optical lithography employed in the manufacture of a semiconductor device, it is important to form an accurate resist pattern. To this end, the prior art employs a method for executing developing period control and size measurement by providing a monitor pattern different from a device pattern and monitoring the intensity of light reflected from the monitor pattern during development or after development.

Japanese Patent Application KOKAI Publication No. 10-300428, for example, discloses a method using a monitor pattern whose element pattern is different from that of a device pattern. In this method, however, a pattern that shows a greater change in size with lapse of development time than the device pattern is used as the monitor pattern, and only this monitor pattern is monitored. Accordingly, when defocusing occurs in an optical system for exposure, a characteristic difference will occur between the device pattern and the monitor pattern. This interrupts accurate developing period control and size measurement.

Further, there is a case where variations will occur in the intensity of reflected light during development, or where lots of time is required until a development interrupting liquid is supplied after the termination of monitoring. If in such a case, a control method for monitoring variations in the intensity of reflected light during development, and stopping development when the measured intensity reaches a threshold value is employed, it is difficult to accurately determine the actual development time period.

With the advance of techniques for refining the size of LSIs, more and more accurate size measurement is required during developing a resist. As afore-mentioned, the method for using a monitor pattern whose element pattern is different from that of a device pattern to measure the size of a resist pattern is disadvantageous in that accurate measurement cannot be realized when defocusing has occurred in an exposure optical system.

BRIEF SUMMARY OF THE INVENTION

The present invention has been developed in light of the above, and aims to provide a pattern estimation method for realizing accurate measurement of the size of a resist pattern even when defocusing has occurred in an exposure optical system.

It is another object of the invention to provide a pattern forming method for accurately determining a development interruption period of a resist to enhance the pattern accuracy.

To attain the first-mentioned object, there is provided a pattern estimating method of exposing a resist film on a to-be-processed substrate, thereby developing a device pattern, and estimating the size of the device pattern, comprising the steps of:

cutting part of the device pattern, using the cut part as an element area or designing an element area by partially changing the size of the cut part, and repeatedly arranging the element area into a monitor pattern;

exposing the device pattern and the monitor pattern when exposing the resist film;

developing the resist film, then applying light of a predetermined wavelength to the monitor pattern, and detecting the intensity of diffracted light reflected from the monitor pattern; and estimating the size of the device pattern corresponding to the intensity of the detected diffracted light on the basis of a relationship between a predetermined diffracted light intensity and a device pattern size.

To attain the second-mentioned object, there is provided a pattern forming method of exposing a resist film on a to-be-processed substrate, thereby developing the exposed resist film for a predetermined period, and forming a device pattern, comprising the steps of:

cutting part of the device pattern, using the cut part as an element area or designing an element area by partially changing the size of the cut part, and repeatedly arranging the element area into a monitor pattern;

exposing both the device pattern and the monitor pattern when exposing the resist film;

developing the resist film, then applying light of a predetermined wavelength to the monitor pattern, and detecting the intensity of diffracted light reflected from the monitor pattern;

estimating the size of the device pattern corresponding to the intensity of the detected diffracted light on the basis of a relationship between a predetermined diffracted light intensity and a device pattern size; and stopping development when the estimated size of the device pattern has reached a desired value.

In the present invention constructed as above, the measurement accuracy is significantly enhanced by monitoring (in particular, monitoring zero-order light under the conditions for preventing generation of diffracted light of one-order or more) diffracted light reflected from a pattern which shows a greater reflected light intensity change with respect to a change in its size than the device pattern, or diffracted light reflected from the device pattern itself. Further, even where defocusing has occurred in the exposure optical system, the size of the device pattern can be determined from the intensity of diffracted light by selecting that one of monitor patterns showing a great reflected light intensity change, which corresponds to the type of the device pattern (i.e. selecting a line-type monitor pattern for a line-type device pattern, or a hole-type monitor pattern for a hole-type device pattern).

In addition, simpler measurement can be executed than in the conventional SEM by optically monitoring a monitor pattern as above in a coater/developer unit. As a result, the throughput can be enhanced. Moreover, monitoring a monitor pattern during developing a resist film can enhance the processing accuracy and hence the yield of the products.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a graph useful in explaining the first embodiment and showing the relationship between the normalized reflected light intensity of a hole-type monitor pattern and the size of a line as a different type pattern from the monitor pattern;

FIG. 5 is a graph useful in explaining the first embodiment and showing the relationship between the normalized reflected light intensity of a line-type monitor pattern and the size of a line as the same type pattern as the monitor pattern;

FIG. 15 is a graph useful in explaining the third embodiment and showing the relationship between the normalized reflected light intensity of a hole-type monitor pattern and the diameter of a hole as the same type pattern as the monitor pattern;

FIG. 16 is a graph useful in explaining the third embodiment and showing variations in the intensity of light reflected from the monitor pattern during development of the pattern;

FIG. 34 is a view showing the location of a monitor area;

FIGS. 35A and 35B are views showing specific examples of a monitor pattern;

FIG. 37 is a view showing measured reflected light intensities;

FIG. 38 is a graph showing variations in the reflected light intensity of a development monitor area;

FIG. 41 is a view showing the relationship between the normalized reflected light intensity of a monitor pattern necessary to determine the reflected light intensity of the monitor pattern used for stopping development, and the line size of an L/S pattern with a width of 175 nm;

FIG. 42 is a graph showing the relationship between the resist film reduction amount and the normalized reflected light intensity;

FIG. 47 is a graph illustrating variations in the reflected light intensity of an L/S pattern with a width of 200 nm during development (wavelength: 550 nm);

FIG. 48 is a graph illustrating those variations in the reflected light intensity of an L/S pattern with a width of 200 nm during development, which are obtained when the underlayer has an ununiform thickness (wavelength: 550 nm);

FIG. 53 is a graph showing variations in the reflected light intensity of an L/S pattern with a width of 200 nm during development (wavelength: 550 nm);

FIG. 54 is a graph showing variations in the reflected light intensity of an L/S pattern with a width of 200 nm during development (wavelength: 550 nm);

FIG. 55 is a graph showing the relationship between the exposure amount and the pattern removal period;

FIG. 56 is a graph showing the relationship between the exposure amount and the developing period that enables the formation of a pattern size to a desired value;

DETAILED DESCRIPTION OF THE INVENTION

Reference will now be made in detail to the presently preferred embodiments of the invention as illustrated in the accompanying drawings.
(First Embodiment)
(Structure)

Figure 1:
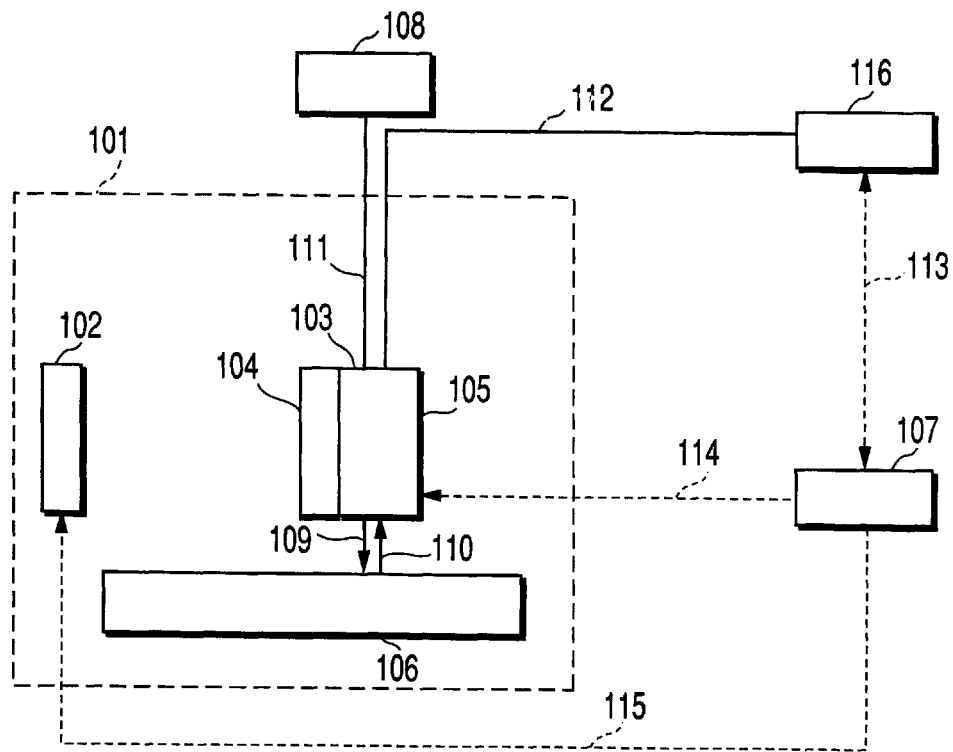
FIG. 1 is a schematic block diagram illustrating a size monitoring device that employs a pattern estimation method according to a first embodiment.

FIG. 1 is a schematic block diagram illustrating a size monitoring device that employs a pattern estimation method according to a first embodiment.

A developing unit 101 for executing development includes a nozzle 102 for supplying a developer, and an arm 103 consisting of a development interrupting liquid supply nozzle 104 and a monitor head 105 which are formed integral as one body. The monitor head 105 is connected to an optical fiber 111 for introducing probe light from a light source 108. Light guided from the optical fiber 111 to the monitor head 105 is converted, via a collimator lens and a narrow-band filter incorporated in the monitor head 105, into parallel light 109 of substantially a single color narrowed to a wavelength of 470 nm (half-width: 5 nm). The parallel light 109 is guided onto a wafer 106.

Reflection light 110 obtained by applying the parallel light 109 to the wafer 106 is detected by a CCD camera in the monitor head 105. The image of the detected light is supplied to an analyzing section 116 via a transmission cable 112. The analyzing section 116 executes pattern matching based on the input image to thereby recognize a monitor pattern area in the image and determine the intensity of light reflected from a monitor pattern.

Figure 2:
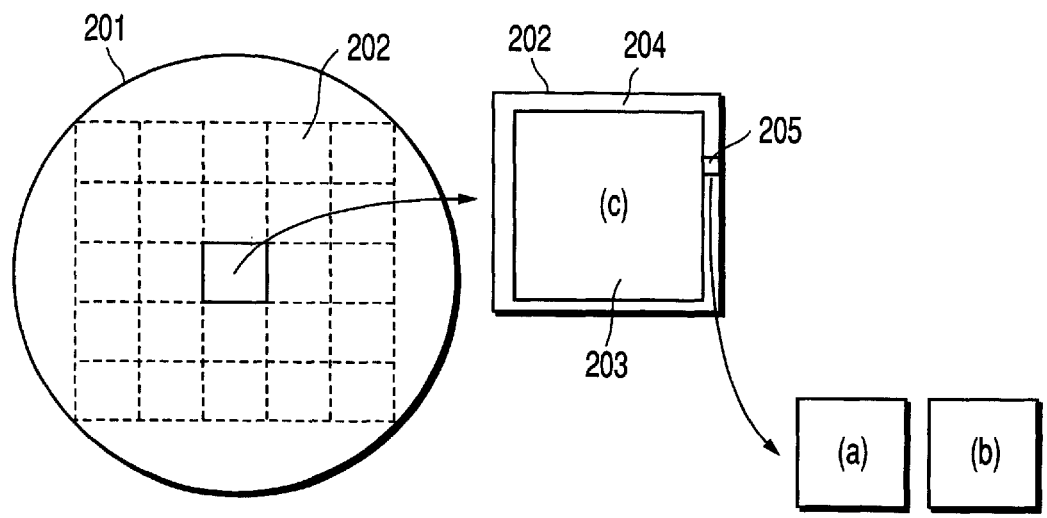
FIG. 2 is a view showing an example of an arrangement of a monitor pattern and a device pattern used in the first embodiment.
Figure 3A:
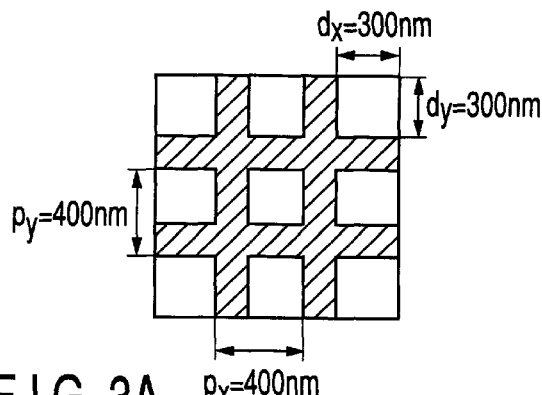
FIGS. 3A–3C are views showing examples of monitor patterns and a device pattern used in the first embodiment.
Figure 3B:
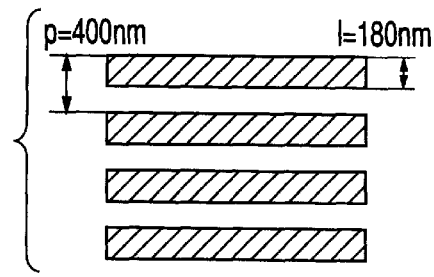
Figure 3C:
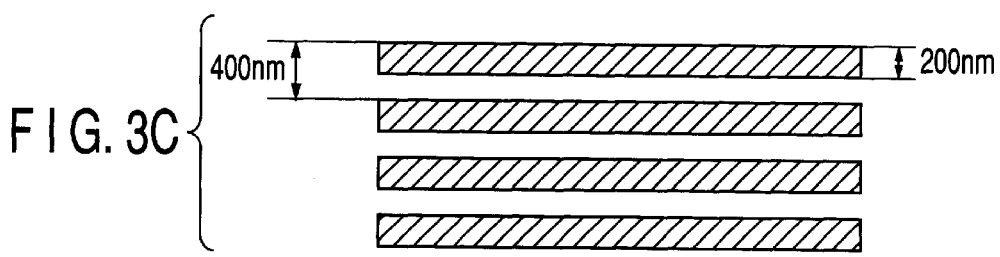

An arrangement of a monitor pattern and a device pattern is shown in FIG. 2. More detailed examples of them are shown in FIGS. 3A–3C. As is shown in FIG. 2, a mark area 204 in which an alignment mark, for example, is printed is provided around a device pattern area 203 in each chip 202 on a wafer 201. A monitor pattern area 205 is included in the mark area 204.

The device pattern area 203 includes an L/S (1:1) pattern with a width of 200 nm as shown in FIG. 3C. The monitor pattern area 205 includes two types of patterns, i.e. a hole-type monitor pattern as shown in FIG. 3A and a line-type monitor pattern as shown in FIG. 3B. The hole-type monitor pattern shown in FIG. 3A is designed to have a pattern pitch (px, py) of 400 nm in x- and y-directions, and each square hole of the monitor pattern is designed to have sides (dx, dy) of 300 nm (which is the size of each exposed hole on a wafer, and similar sizes specified below are those of holes, width, etc. of patterns on a wafer). The line-type monitor pattern shown in FIG. 3B is designed to have a pattern pitch (p) of 400 nm and a line width (l) of 180 nm.

When measuring the size of a resist pattern on the basis of the intensity of zero-order light, it is desirable to execute monitoring so that the zero-order light intensity will vary in accordance with a change in the remaining area of the resist. In general, in the case of a pattern with a regular pitch, diffracted light beams of several orders occur. If zero-order light is monitored under the condition that will cause first-order or more diffracted light, the diffraction efficiency changes due to the remaining area of the resist. This means that a change in the intensity of zero-order light does not directly indicate the remaining area of the resist.

In light of this, monitoring is executed under the condition that will not cause first-order or more diffracted light. Supposing that the angle of incident light is $\theta_i$, its wavelength $\lambda$, and the pitch of the monitor pattern P, that condition is expressed by the following formula:

$$|\sin(\theta_i) - (\lambda/P)| > 1 \qquad (1)$$

In this embodiment, so as to satisfy the condition, monitoring is executed with P=400 nm, $\lambda$=470 nm and $\theta_i$=0° (this means that light is applied to the wafer from just above it).

Although in the embodiment, only zero-order light is monitored, the invention is not limited to this. If the size can be estimated accurately by detecting first-order or more light and analyzing the detection result, first-order or more diffracted light may be monitored.
(Operation)

A method for measuring the size after development, employed in this embodiment, will be described.

After a wafer 106 is transferred to the developing unit 101, a developing liquid is applied onto the wafer 106 by the developing nozzle 102. After a predetermined period, the arm 103, which consists of the development interruption liquid supply nozzle 104 and the monitor head 105 formed integral as one body, is moved to the center of the unit 101, thereby supplying development interruption liquid and rinsing the wafer. Subsequently, the wafer 106 is dried, and the monitor head 105 is moved to a position in which it can monitor the monitor pattern area 205 shown in FIG. 2. At this time, reference is made to a shot map that indicates where in the X and Y directions the to-be-exposed shot is located, and also reference is made to a mask layout that indicates in which portion of one shot the monitor pattern is situated. Then, the position of the monitor pattern is detected by pattern matching, and the reflected light intensity of the pattern is also detected. After that, the pattern size is calculated from the relationship between the reflected light intensity and the size of the monitor pattern, which is obtained in advance.

FIG. 4 shows the relationship between the normalized reflected light intensity of the hole-type monitor pattern of FIG. 3A and the size of an L/S pattern with a width of 200 nm. FIG. 5 shows the relationship between the normalized reflected light intensity of the line-type monitor pattern of FIG. 3B and the size of an L/S pattern with a width of 200 nm. The normalized reflected light intensity is calculated on condition that the reflected light intensity of each resist remaining portion is 1. As is understood from FIGS. 4 and 5, an excellent linear relationship is established therebetween at the time of just focusing, which means that the size can be measured from the reflected light intensity. Further, the reflected light intensity varies by 7% where the size varies within a range of 200±5 nm, which means that the variation amount of the reflected light intensity is greater than that (5%) of the size. In other words, it means that higher size measurement accuracy can be realized by monitoring a monitor pattern than by monitoring a device pattern itself.

However, the difference between the monitor patterns shown in FIGS. 3A and 3B influences the relationship between the normalized reflected light intensity of a monitor pattern and the size of an L/S pattern, when the exposure optical system is in a defocusing state. Even when, in the case of the line-type monitor pattern, the system is in the defocusing state, the relationship therebetween is the same as that obtained when the system is in a focusing state. In the case of the hole-type monitor pattern, however, the relationship therebetween in the focusing state differs from that in the defocusing state. In light of this, when monitoring the L/S pattern of 200 nm, it is desirable that the line-type monitor pattern should be used and the size should be calculated on the basis of the relationship shown in FIG. 5.

Figure 6A:
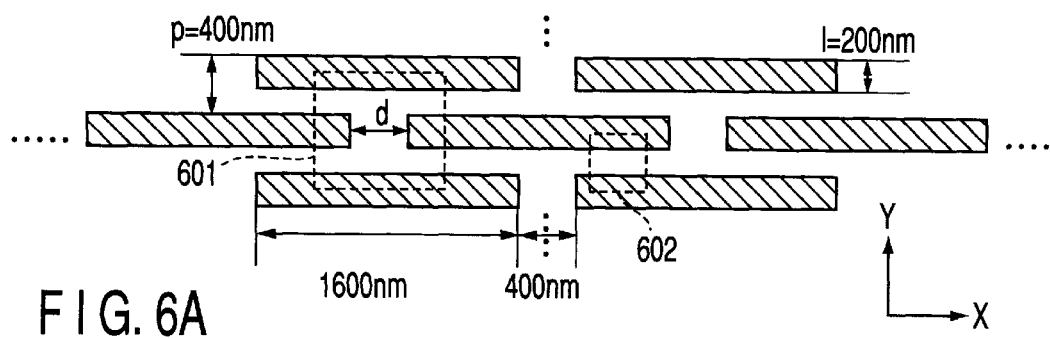
FIGS. 6A and 6B are views illustrating variations in device pattern used in the first embodiment.
Figure 6B:
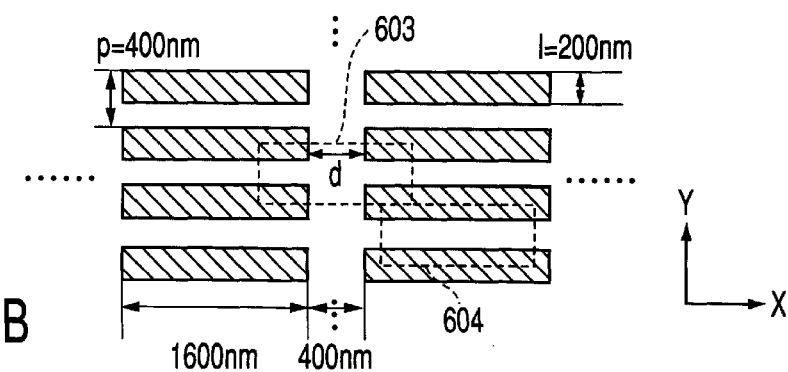
Figure 7A:
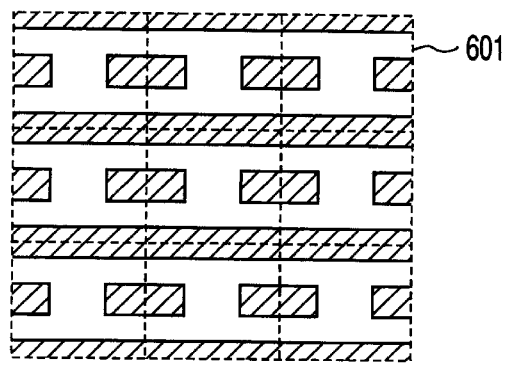
FIGS. 7A–7D are views illustrating examples of monitor patterns obtained by repeatedly arranging element areas cut out of the patterns shown in FIGS. 6A and 6B.
Figure 7B:
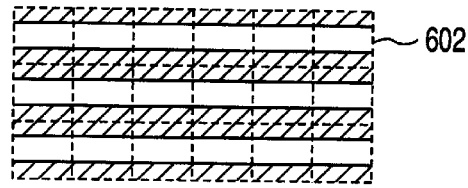

Although in this embodiment, the monitor pattern shown in FIG. 3B is used, the invention is not limited to this. Where the relationship between the normalized reflected light intensity of a monitor pattern and the size of an L/S pattern significantly differs between a monitor pattern and a device pattern, it is also effective to monitor the zero-order light of the device pattern itself, since the intensity of the zero-order light is determined from the square of the opening ratio. Where the line-type device pattern is as shown in FIG. 6A or 6B, an L/S pattern with a width of 200 nm may be used as a monitor pattern. A monitor pattern (an L/S pattern with a width of 200 nm) as shown in FIG. 7B can be obtained by repeatedly arranging a rectangular element area 602 formed by cutting part of the device pattern shown in FIG. 6A.

Figure 7C:
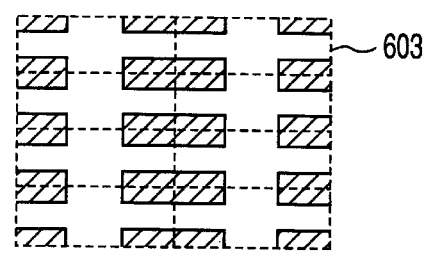
Figure 7D:
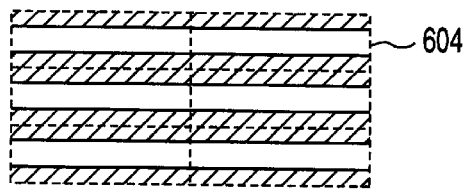

Further, a monitor pattern (an L/S pattern with a width of 200 nm) as shown in FIG. 7D can be obtained by repeatedly arranging a rectangular element area 604 formed by cutting part of the device pattern shown in FIG. 6B.

In the patterns shown in FIGS. 6A and 6B, the area whose size varies in the longitudinal direction has a length of 1600 nm in each section with a length of 2000 nm. On the other hand, in the case of the patterns shown in FIGS. 7B and 7D, the entire portion of the L/S pattern with the width of 200 nm varies in the longitudinal direction. Accordingly, the use of the patterns shown in FIGS. 7B and 7D increases a change in opening ratio.

Furthermore, a monitor pattern may be formed by repeatedly arranging a rectangular element area 601 or 603 which is obtained by cutting part of the device pattern as shown in FIG. 6A or 6B. In this case, the portion (with a size d between two adjacent longitudinal patterns as shown in FIG. 6A or 6B) included in the device pattern, for which size accuracy is strictly demanded, is used as an element area, and the monitor pattern is arranged such that lots of such element areas are included in each unit section of the pattern. In other words, the monitor pattern is designed such that it includes lots of important information pieces, thereby enhancing the accuracy. A monitor pattern obtained by repeatedly arranging the element area 601 is shown in FIG. 7A, while a monitor pattern obtained by repeatedly arranging the element area 603 is shown in FIG. 7C.

The element area 601 is a rectangular area formed by two Y-directional line segments that intersect two line patterns adjacent in the X-direction, and two X-directional line segments that pass central portions of line patterns arranged with the first-mentioned two patterns interposed therebetween. The area 601 includes end portions of X-directionally adjacent line patterns. The element areas 602 and 604 are rectangular areas formed by two X-directional line segments that pass respective central portions of Y-directionally adjacent line patterns, and do not contact the X-directional ends of them. The element area 603 is a rectangular area formed by two X-directional line segments that pass respective central portions of Y-directionally adjacent line patterns, and Y-directional line segments that extend between the Y-directional adjacent line patterns. This element area includes end portions of four line patterns adjacent to each other in the X- and Y- directions such that half of each end portion is included in the element area.

As described above, the monitor pattern may consist of a pattern obtained by cutting part of a device pattern, using it as an element area and repeatedly arranging it, or repeatedly arranging it with its size slightly altered. Moreover, although in the above examples, the size measurement is executed in a developing unit after it is developed, it may be executed using a similar structure before a wafer is returned to a carrier in a coater/developer unit.

(Advantages)

In the above embodiment, the diffracted light intensity of a pattern that shows a great change in reflected light intensity with respect to a change in the size of a device pattern, or the diffracted light intensity of the device pattern itself is monitored under the conditions which do not cause first-order or more diffracted light. This significantly enhances the degree of measurement accuracy. Further, for a line-type device pattern, a line-type monitor pattern is used among monitor patterns that show a great change in reflected light intensity. This enables accurate monitoring of the size of the device pattern on the basis of the diffracted light intensity even when defocusing has occurred. In addition, execution of optical size measurement in a coater/developer unit after development enables simpler measurement than a conventional SEM, thereby enhancing the throughput.

(Second Embodiment)
(Structure)

A size monitoring apparatus adapted for a pattern forming method according to a second embodiment of the invention has a similar basic structure to the apparatus shown in FIG. 1. Although the structure of the apparatus slightly differs depending upon the method of development, stationary development in which a wafer is kept still while development is executed is employed in this embodiment.

In this embodiment, a monitor pattern and a device pattern as shown in FIGS. 2 and 3 are employed. As in the first embodiment, the monitor pattern is located in a mark area where an alignment mark, for example, is printed.

The device pattern area includes an L/S (1:1) pattern with a width of 200 nm as shown in FIG. 3C. The monitor pattern area includes two types of patterns, i.e. a hole-type monitor pattern as shown in FIG. 3A and a line-type monitor pattern as shown in FIG. 3B. The hole-type monitor pattern is designed to have a pattern pitch (px, py) of 400 nm in x- and y-directions, and each square hole of the monitor pattern is designed to have sides (dx, dy) of 300 nm (which is the size of each exposed hole on a wafer). The line-type monitor pattern is designed to have a pattern pitch (p) of 400 nm and a line width (l) of 180 nm.

As in the first embodiment, a line-type monitor pattern (FIG. 3B) is used as the monitor pattern in the second embodiment. Since as aforementioned in the first embodiment, this monitor pattern shows a greater intensity change for a size change than the device pattern, and hence can be used for accurate size estimation.

The wavelength of incident light, the incident angle of the light and the monitor pattern pitch are set at 470 nm, 0° and 400 nm, respectively, for the same reason as stated in the first embodiment. Although in this embodiment, zero-order light is monitored, the invention is not limited to this. If accurate size estimation can be made by detecting first-order or more diffracted light and using a detection result for analysis, multi-order diffracted light may be monitored.

(Operation)

A monitoring of development method employed in this embodiment will now be described.

After a wafer 106 is transferred to the developing unit 101, a developing liquid is applied onto the wafer 106 by the developing nozzle 102. Subsequently, an arm 103, which consists of a development interruption liquid supply nozzle 104 and a monitor head 105 formed integral as one body, is moved to a position in which a monitor pattern shown in FIG. 2 is placed, on the basis of a shot map and a mask layout. While executing development, the position of the monitor pattern is detected by pattern matching, thereby detecting its reflected light intensity.

The relationship between the normalized reflected light intensity of a line-type monitor pattern and the size of an L/S pattern with a width of 200 nm is shown in FIG. 5. It is understood from FIG. 5 that development must be finished at a reflected light intensity of 0.832 in order to obtain a desired size of 200 nm. However, during development, the reflected light intensity of the pattern significantly varies as a result of the supply of a developer at the beginning of development, and fluctuates even after a long period of development. Accordingly, if the termination point of development is determined directly from the reflected light intensity threshold value, it is possible that an error will occur.

Figure 8:
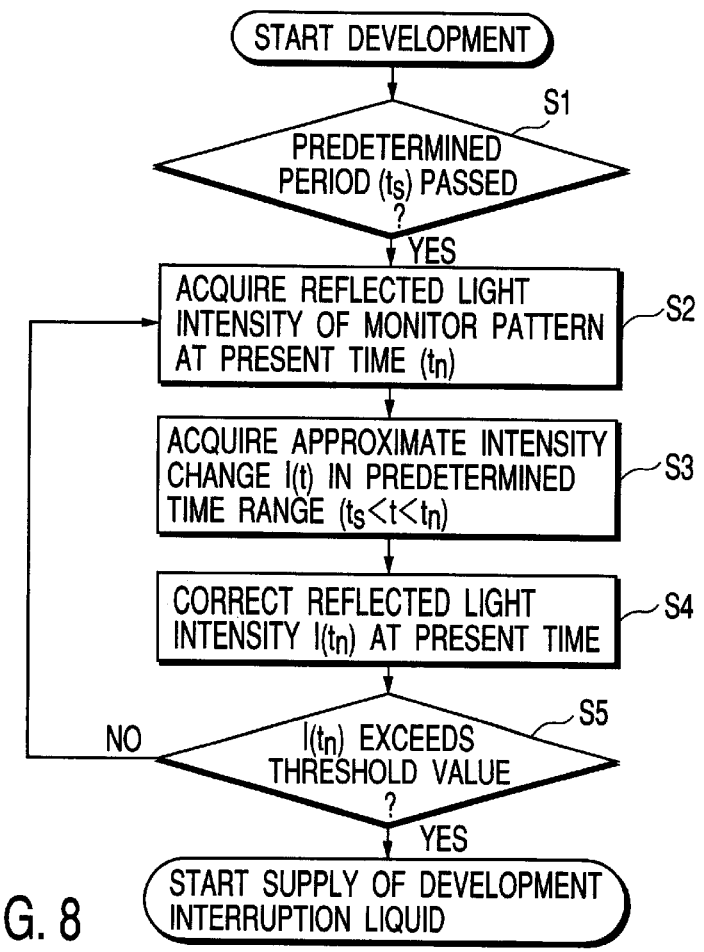
FIG. 8 is a flowchart useful in explaining an algorithm used in a second embodiment for monitoring a monitor pattern during development.

To avoid it, the termination of development is determined using algorithm as shown in FIG. 8. First, to remove intensity fluctuation at the beginning of development, it is determined whether or not a predetermined period ($t_s$) has passed after the start of development (step S1). After the predetermined period ($t_s$), monitoring is started (step S2). Subsequently, the reflected light intensity is measured in a realtime manner. Since, the reflected light intensity slightly fluctuates, approximations for reflected light intensity fluctuations from the monitoring start time ($t_s$) to the present time ($t_n$) are made using a certain function ($I(t_n)$) (step S3). As a result, an approximate value of the present reflected light intensity ($I(t_n)$) is calculated (step S4). It is determined whether or not the approximate value of the present reflected light intensity reaches a desired value (step S5). If it is determined that the approximate value reaches the desired value, the supply of a developing interruption liquid is started.

Figure 9:
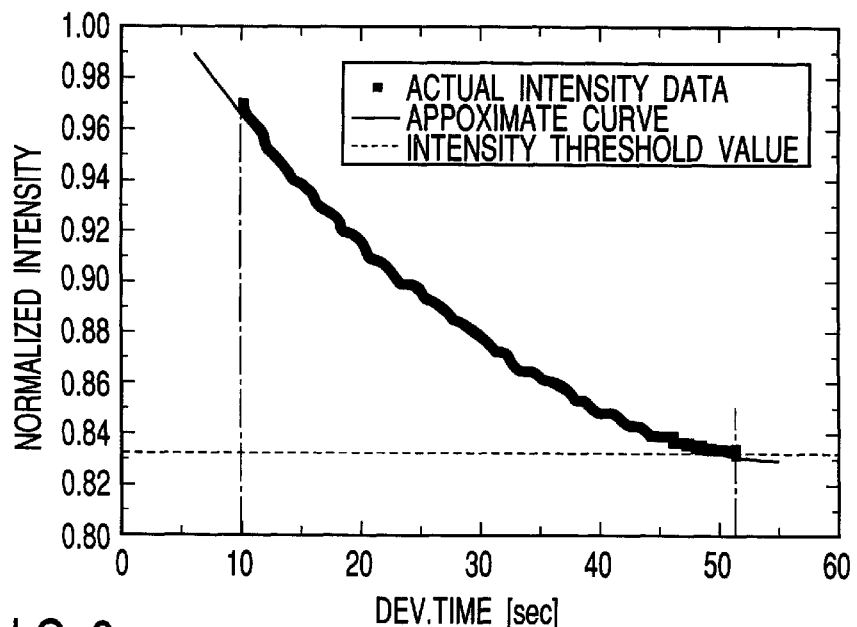
FIG. 9 is a graph useful in explaining the second embodiment and showing variations in the intensity of light reflected from a monitor pattern during development of the pattern.

FIG. 9 shows variations in reflected light intensity during actual development. In this case, monitoring is started ten seconds after the start of development, and the reflected light intensity variations are approximated using a quadratic function, thereby obtaining the present reflected light intensity. When the reflected light intensity has reached 0.832 (i.e. fifty two seconds after the start of development), the supply of the development interruption liquid is started.

Although this embodiment employs a monitor pattern shown in FIG. 3B, the invention is not limited to this. Where the relationship between the normalized reflected light intensity of a monitor pattern and the size of an L/S pattern significantly differs between a monitor pattern and a device pattern, it is also effective to monitor the zero-order light of the device pattern itself, since the intensity of the zero-order light is determined from the square of the opening ratio.

Where the line-type device pattern is as shown in FIG. 6A or 6B, an L/S pattern with a width of 200 nm (obtained by repeatedly arranging the element area 602 in the case of FIG. 6A, or the element area 604 in the case of FIG. 6B) may be used as a monitor pattern. This is because in this case, a change in opening ratio increases. Specifically, in the case of the patterns of FIGS. 6A and 6B, the area whose size varies in the longitudinal direction has a length of 1600 nm in each section with a length of 2000 nm. On the other hand, the entire portion of the L/S pattern with the width of 200 nm varies in the longitudinal direction.

Furthermore, a monitor pattern may be formed by repeatedly arranging a rectangular element area 601 or 603 which is obtained by cutting part of the device pattern shown in FIG. 6A or 6B. In this case, the portion included in the device pattern, for which size accuracy is strictly demanded, is used as an element area, and the monitor pattern is arranged such that lots of element areas as above are included in each unit section of the pattern. In other words, the monitor pattern is designed such that it includes lots of important information pieces, thereby enhancing the accuracy.

As described above, the monitor pattern may consist of a pattern obtained by cutting part of a device pattern, using it as an element area and repeatedly arranging it, or repeatedly arranging it with its size slightly altered.

(Advantages)

In the above embodiment, the diffracted light intensity of a pattern that shows a great change in reflected light intensity with respect to a change in the size of a device pattern, or the diffracted light intensity of the device pattern itself is monitored under the conditions which do not cause first-order or more diffracted light. After that, the developing period is controlled on the basis of a monitoring result. This enhances the degree of measurement accuracy. Further, calculation of an approximate value for the present reflected light intensity change can suppresses fluctuations of reflected light intensity during development, thereby enhancing the measurement accuracy. As a result, the yield of the products further increases.

Moreover, optical size measurement during development enables simpler measurement than the conventional SEM, thereby enhancing the throughput.

(Third Embodiment)
(Structure)

Figure 10:
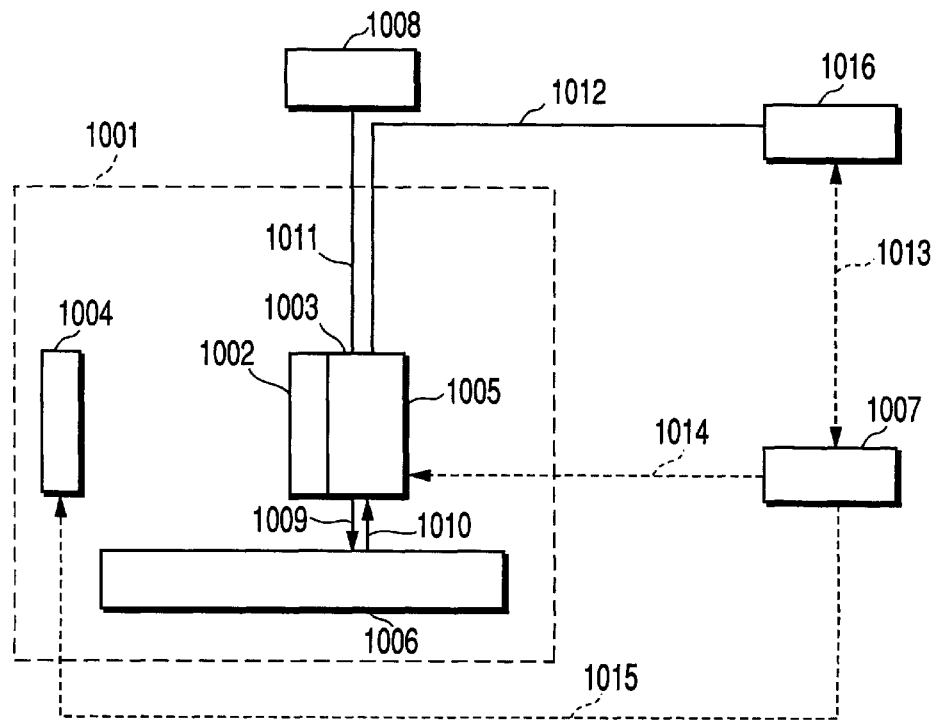
FIG. 10 is a schematic view illustrating a size monitoring device used for executing a pattern forming method according to a third embodiment.

FIG. 10 is a schematic view showing a size monitoring apparatus adapted for a pattern forming method according to a third embodiment of the invention. The structure of the apparatus differs depending upon the development method. This embodiment employs a structure adapted for stationary development in which a wafer is kept still during development. The apparatus employed differs from the apparatus of FIG. 1 in that in the former, the monitor head is mounted on a developing nozzle, not on the development interruption liquid supply nozzle.

A developing unit 1001 for executing development includes a development interrupting liquid supply nozzle 1004, and an arm 1003 consisting of a nozzle 1002 for supplying a developer and a monitor head 1005 which are formed integral as one body. The monitor head 1005 is connected to an optical fiber 1011 for introducing probe light from a light source 1008. Light guided from the optical fiber 1011 to the monitor head 1005 is converted, via a collimator lens and a narrow-band filter incorporated in the monitor head 1005, into parallel light 1009 of substantially a single color narrowed to a wavelength of 470 nm (half-width: 5 nm). The parallel light 1009 is guided onto a wafer 1006.

Reflection light 1010 obtained by applying the parallel light 1009 to the wafer 1006 is detected by a CCD camera in the monitor head 1005. The image of the detected light is supplied to an analyzing section 1016 via a transmission cable 112. The analyzing section 1016 executes pattern matching based on the input image to thereby recognize a monitor pattern area in the image and determine the intensity of light reflected from a monitor pattern.

Figure 11:
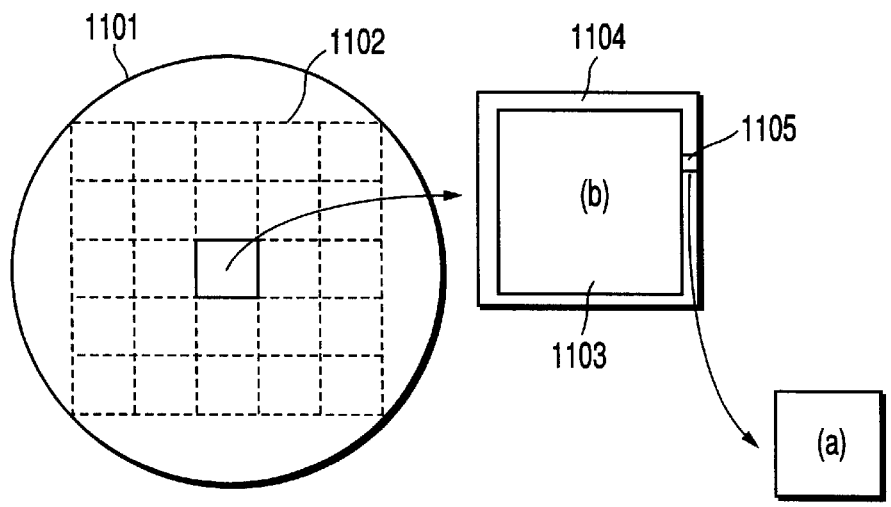
FIG. 11 is a view showing an example of an arrangement of a monitor pattern and a device pattern used in the third embodiment.
Figure 12A:
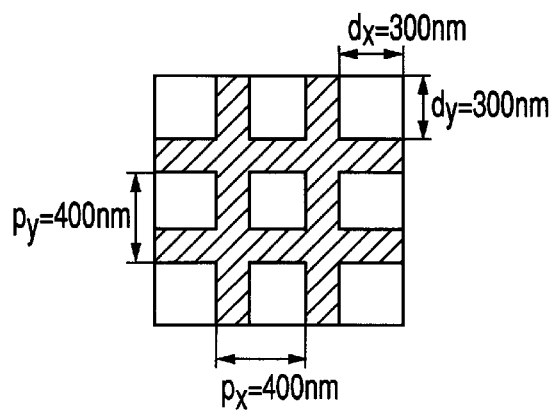
FIGS. 12A and 12B are views showing other examples of arrangements of the monitor pattern and the device pattern used in the third embodiment.
Figure 12B:
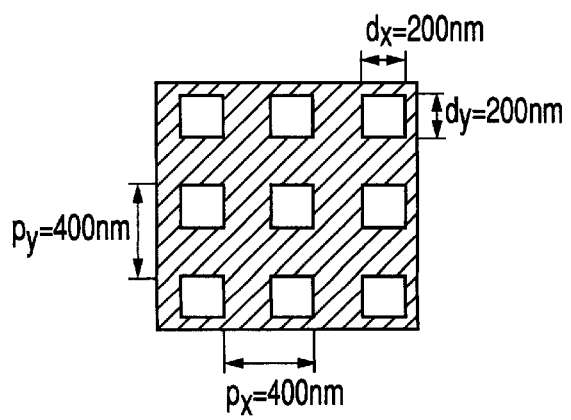

FIG. 11 shows an example of an arrangement of a monitor pattern and a device pattern, while FIGS. 12A and 12B show it in more detail. As is shown in FIG. 11, in each chip 1102 on the wafer 1101, a mark area 1104 where an alignment mark, for example, is printed is provided around a device pattern area 1103. A monitor pattern area 1105 for forming a monitor pattern therein is provided in the mark area 1104.

A square hole pattern having one side of 200 nm is formed in the device pattern 1103 with a pitch of 400 nm, as is shown in FIG. 12B. A hole-type monitor pattern as shown in FIG. 12A is formed in the monitor pattern area 1105. The hole-type monitor pattern is designed to have a pattern pitch (px, py) of 400 nm in x- and y-directions, and each square hole of the monitor pattern is designed to have sides (dx, dy) of 300 nm (which is the size of each exposed hole on a wafer).

In the first embodiment, a line-type monitor pattern is suitable for a line-type device pattern. Similarly, a hole-type monitor pattern is suitable for a hole-type device pattern. Accordingly, the hole-type monitor pattern shown in FIG. 12A is employed as the monitor pattern. This monitor pattern shows a greater reflected light intensity change for a size change than the device pattern, and hence can be used for accurate size estimation.

The wavelength of incident light, the incident angle of the light and the monitor pattern pitch are set at 470 nm, 0° and 400 nm, respectively, for the same reason as stated in the first embodiment. Although in this embodiment, zero-order light is monitored, the invention is not limited to this. If accurate size estimation can be made by detecting first-order or more diffracted light and using a detection result for analysis, multi-order diffracted light may be monitored.

(Operation)

A development monitoring method employed in this embodiment will be described.

After the wafer 1006 is transferred to the developing unit 1001, a developing liquid is applied onto the wafer 1006 by the developing nozzle 1002. Subsequently, the arm 1003, which consists of the developing nozzle 1002 and the monitor head 1005 formed integral as one body, is moved to a position in which a monitor pattern shown in FIG. 12A is placed, on the basis of a shot map and a mask layout. The developing nozzle 1002 supplies a development liquid. The monitor head 1005 detects the position of the monitor pattern by pattern matching, thereby detecting the reflected light intensity of the monitor pattern.

The relationship between the normalized reflected light intensity of a hole-type monitor pattern and a device pattern with holes each having one side of 200 nm is shown in FIG. 15. It is understood from FIG. 15 that development must be finished at a reflected light intensity 0.85 in order to obtain a desired size of 200 nm. However, during development, the reflected light intensity of the pattern significantly varies as a result of the supply of a developer at the beginning of development, and fluctuates even after a long period of development. Accordingly, if the termination point of development is determined directly from the reflected light intensity threshold value, it is possible that an error will occur. Moreover, where the monitor head is mounted on the developing nozzle, a certain period (in this embodiment, six seconds) is necessary to move the arm before the start of supply of the development interruption liquid.

Figure 14:
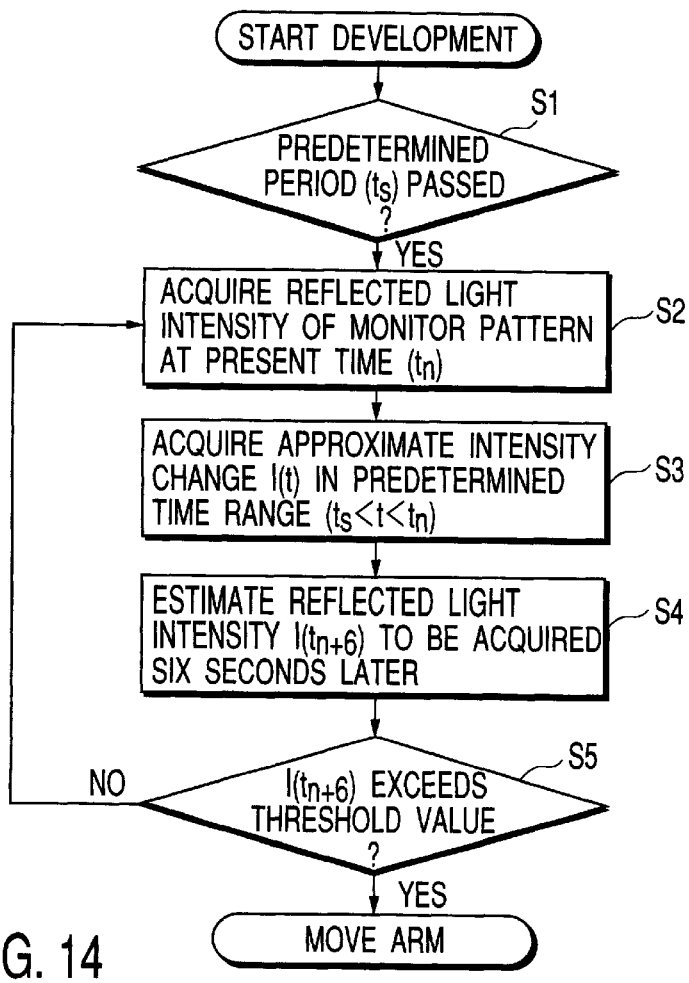
FIG. 14 is a flowchart useful in explaining an algorithm used in the third embodiment for monitoring a monitor pattern during development.

In light of the above, the termination of development is determined using algorithm as shown in FIG. 14. First, to remove reflected light intensity fluctuation at the beginning of development, it is determined whether or not a predetermined period ($t_s$) has passed after the start of development (step Si). After the predetermined period ($t_s$), monitoring is started (step S2). Subsequently, the reflected light intensity is measured in a realtime manner. Since at this time, the reflected light intensity slightly fluctuates, approximations for reflected light intensity fluctuations from the monitoring start time ($t_s$) to the present time ($t_n$) are made using a certain function (I(t)) (step S3). As a result, an approximate value of a reflected light intensity ($I(t_n+6)$) six seconds after the present time is calculated (step S4).

After that, it is determined whether or not the estimated reflected light intensity obtained six seconds later reaches a desired value (step S5). If it is determined that the estimated reflected light intensity reaches the desired value, the arm 1003 with the monitor head mounted thereon is retreated and the development interruption liquid supply nozzle 1002 is moved to the center, thereby starting the supply of the development interruption liquid.

FIG. 16 shows variations in reflected light intensity during actual development. In this case, monitoring is started ten seconds after the start of development, and the reflected light intensity variations are approximated using a quadratic function, thereby obtaining a reflected light intensity obtained six seconds after the present time. When the reflected light intensity obtained six seconds after the present time has reached 0.85 (i.e. twenty two seconds after the start of development), the movement of the arm is started to thereby start the supply of the development interruption liquid after six seconds elapse (twenty eight seconds after the start of development).

Figure 13A:
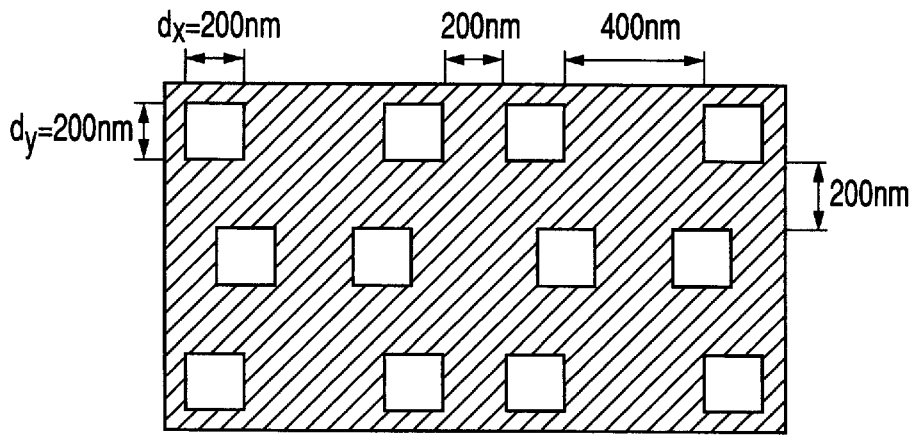
FIGS. 13A–13C are views showing other variations of the monitor pattern used in the third embodiment.
Figure 13B:
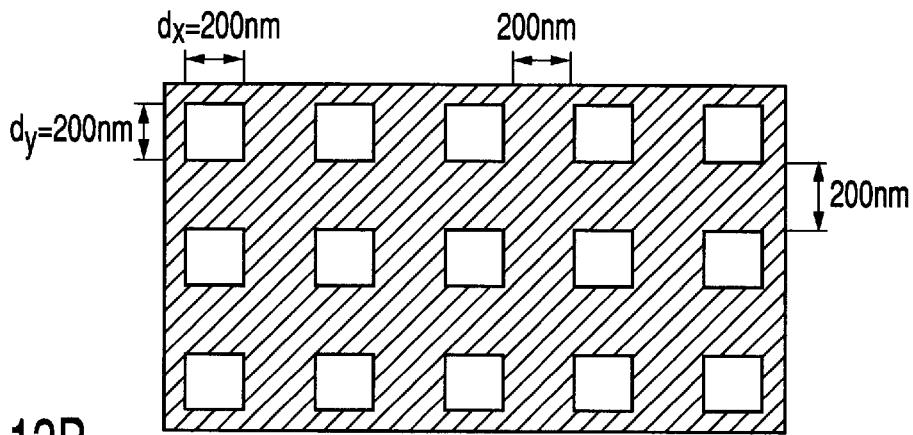
Figure 13C:
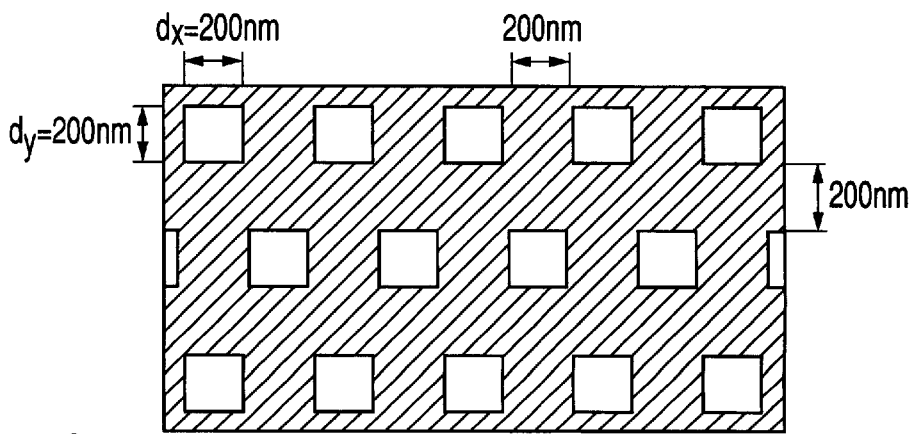

Although this embodiment uses a monitor pattern shown in FIG. 12B, the invention is not limited to it. In the case of another hole-type device pattern as shown in FIG. 13A (the final opening ratio: 0.21), monitor patterns as shown in FIGS. 13B and 13C (the final opening ratio: 0.25) may be used as the monitor pattern. Each figure shows only a basic structure, and each pattern is actually arranged two-dimensionally. In the examples shown in FIGS. 13B and 13C, the element area is also formed of a hole-type pattern in order to make the characteristics of the area at the time of defocusing, be the same as those of the device pattern.

In addition, since the intensity of the zero-order light is determined from the square of the opening ratio, a great change in reflected light intensity can be obtained when using a pattern having a higher opening ratio than the device pattern (in this case, the device pattern has an opening ratio of 0.21, while the monitor pattern has an opening ratio of 0.25). Accordingly, it suffices if the monitor pattern has an opening ratio higher than the device pattern, and it can have any pattern arrangement (although a regular pattern arrangement is desirable). Further, it is preferable that a designed element area is used, with its size unchanged, in a portion which requires strict size setting, while in any other portion, the size of a designed element area is changed so as to increase the opening ratio as high as possible.

Where, as in the line-type pattern employed in the first or second embodiment, the relationship between the normalized reflected light intensity of a monitor pattern and the size of an L/S pattern significantly differs between a monitor pattern and a device pattern depending upon the properties of a resist or an illumination condition, it is also effective to monitor the zero-order light of the device pattern itself, since the intensity of the zero-order light is determined from the square of the opening ratio (the square of the size).

(Advantages)

In this embodiment, the diffracted light intensity of a pattern that shows a great change in reflected light intensity with respect to a change in the size of a device pattern, or the diffracted light intensity of the device pattern itself is monitored under the conditions which do not cause first-order or more diffracted light. Further, the developing period is controlled. These processes significantly enhance the degree of size processing accuracy and hence enhance the yield of the products.

Furthermore, execution of optical size measurement during development enables simpler measurement than a conventional SEM, thereby enhancing the throughput. In addition, even when a certain period is necessary from the termination of monitoring to the start of rinsing, accurate size estimation can be executed by calculating an approximate reflected light intensity change.

(Fourth Embodiment)
(Structure)

Figure 17:
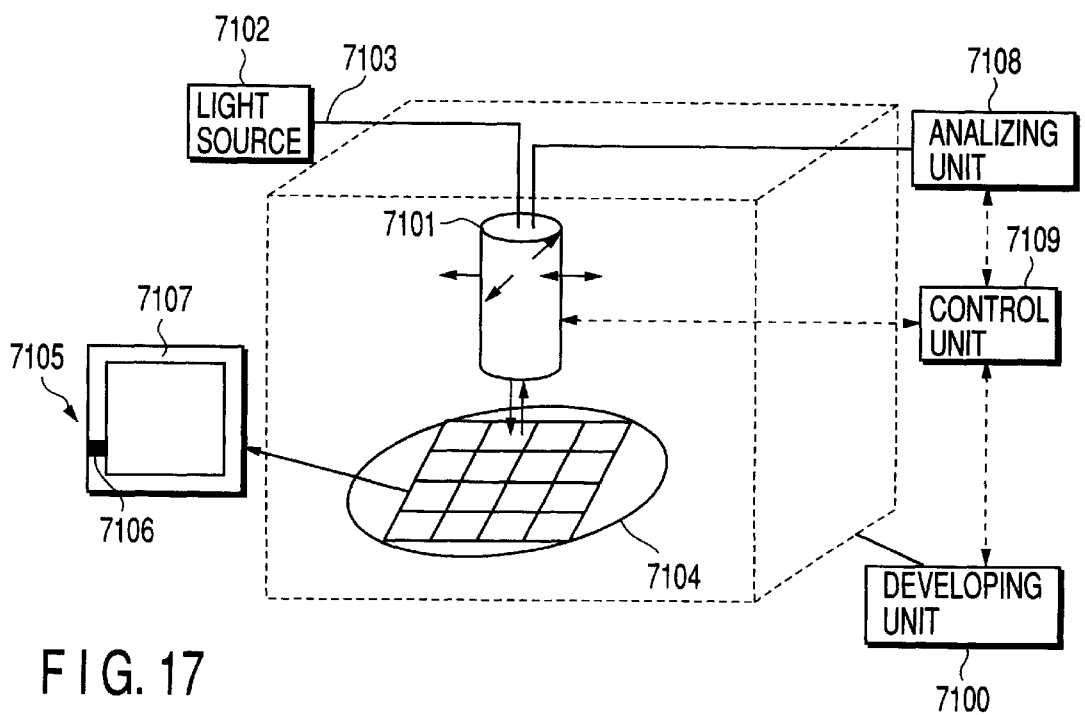
FIG. 17 is a schematic view showing a developing unit according to a fourth embodiment.

In a fourth embodiment, a description will be given of a case where in a developing unit, a monitor area is monitored after a latent image is formed therein and while the latent image is developed. FIG. 17 is a schematic view showing the structure of a developing unit according to the fourth embodiment.

A developing unit 700 contains units necessary for usual development and rinsing, and also a monitor head 701 for monitoring. The monitor head 701 is connected to a probing light source 702 (which contains a plurality of narrow band filters that enable selection of a wavelength suitable for each condition), and also to a fiber 703 for introducing light into the monitor head 701. A collimator lens incorporated in the monitor head 701 enables illumination of a wafer 704 with parallel light of substantially a single color narrowed to a particular wavelength.

Light reflected from the wafer 704 is detected by a CCD camera incorporated in the monitor head 701. The monitor head 701 is responsive to a signal from a control section 709 in the apparatus for scanning the wafer 704 so that it can monitor a monitor area 706 provided in each of chips (chip areas) 705 on the wafer 704. The monitor head 701 is adapted to move to a position in which it can detect the monitor area of a predetermined chip, on the basis of a mask layout and an exposure shot map, then to pick up an image of the monitor area and to send the image to an analysis section 708. Further, the monitor head can recognize the monitor area by pattern matching, and obtain the intensity of light reflected from the monitor area. Each chip 705 includes not only an area that operates as a device, but also an area in which a test pattern or a mark is provided.

As shown in FIG. 17, the monitor area 706 is provided in the mark area 707 which is formed on the dicing line of the wafer. A pattern having a predetermined transmittance is used as a mask pattern for forming the monitor area. The pattern with a predetermined transmittance is a pattern of a regular pattern arrangement, which has a pitch that permits only zero-order diffracted light to reach the wafer. This pattern is produced by appropriately setting the ratio between the to-be-removed portion and the to-be-left portion of the mask.

The conditions that permit only zero-order diffracted light to reach the wafer are given by the following formula:

$$\lambda/p \geq (1+\sigma)NA \quad (2)$$

where $\lambda$ represents the wavelength of exposing light, p the pitch of the pattern arrangement on the wafer, NA the numerical aperture of the optical system, and $\sigma$ a coherence factor.

In light of the conditions during exposure (NA: 0.6; $\sigma$:0.75; Exposure wavelength: 248 nm), the pitch of the mask pattern on the wafer is set at 220 nm. This pattern pitch enables the formation of the mask pattern having the predetermined transmittance.

The transmittance T of the pattern is given by $$T=(d/p)^2 \quad (3)$$

where p represents the pattern pitch, and d the space width of the pattern.

Where the transmittance of the mask pattern is determined, the film reduction amount of a latent image in the monitor area and the rate of development are determined on the basis of the amount of exposure.

Figure 18:
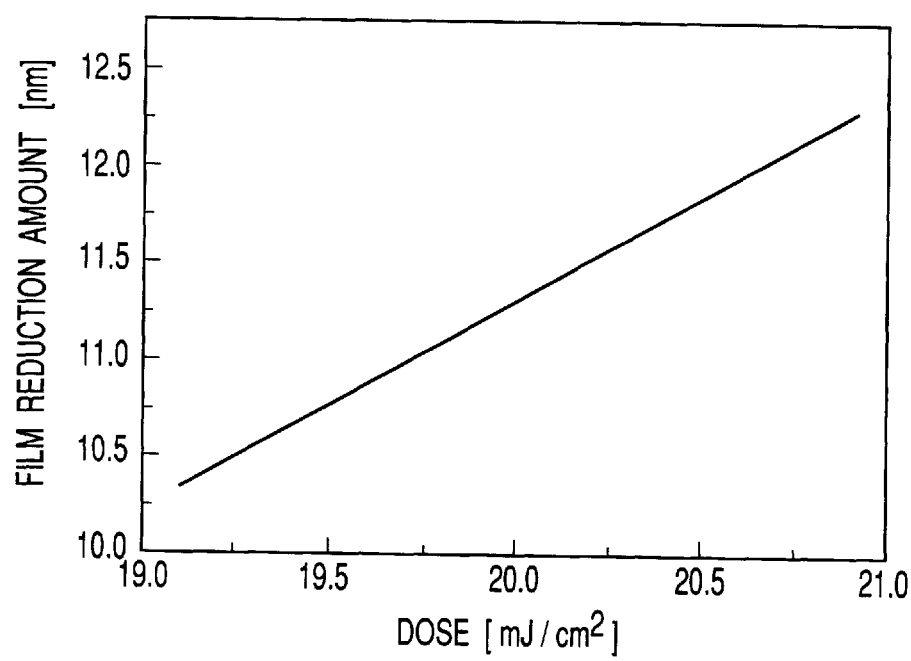
FIG. 18 is a view showing the relationship between the exposure amount and the film reduction amount of a monitor area in which a latent image is formed.
Figure 19:
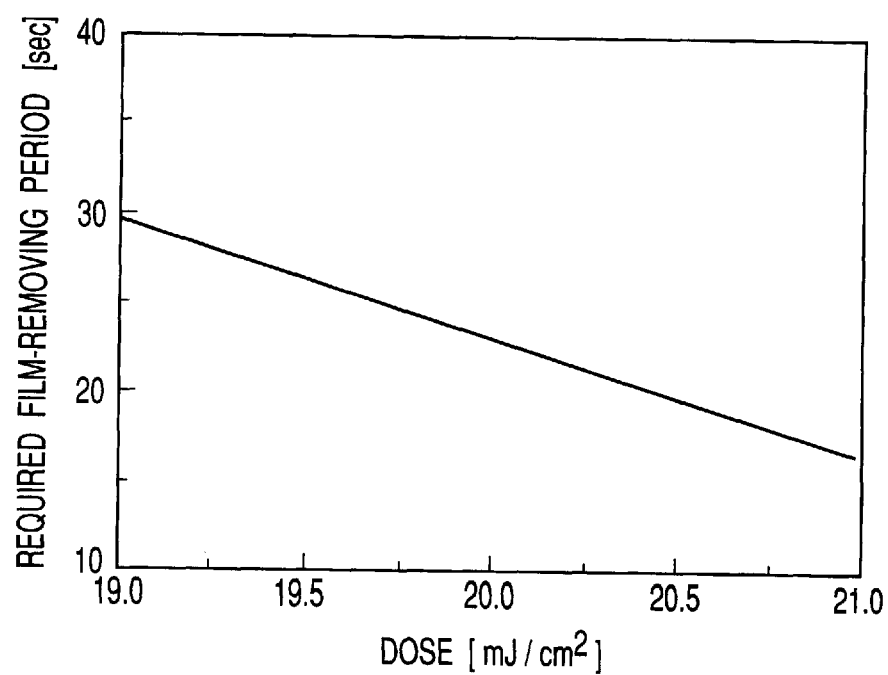
FIG. 19 is a view showing the relationship between the exposure amount and the film removal period of a monitor area.

FIG. 18 shows the relationship between the exposure amount (dose) and the film reduction amount where the transmittance of a mask pattern for forming the monitor area is set at 46.9%. FIG. 19 shows the relationship between the exposure amount and the period required for film removal under the same condition as in FIG. 18. In this case, a target pattern to be formed is an L/S pattern with a width of 200 nm, and the relationship in FIG. 18 or 19 is obtained where the exposure amount is in the vicinity of 20 mJ/cm$^2$ at which a target pattern with an L/S ratio of 1:1 can be formed. Further, in this case, the thickness of the resist film is 400 nm, and the thickness of a reflection preventing film is 60 nm (the same conditions as these are employed in this embodiment).

As is shown in FIG. 18, the dose is proportional to the film reduction amount, which means that the dose can be calculated from the film reduction amount. Accordingly, the dose can be obtained by monitoring the latent image monitor area and measuring the film reduction amount. Similarly, as is shown in FIG. 19, the dose is proportional to the period required for film removal, which means that the dose can be calculated from the period required for film removal. Accordingly, the dose can be obtained by executing monitoring during development and measuring the period required for film removal.

In this embodiment, when monitoring a latent image, the intensity of light reflected from the latent image, which corresponds to the film reduction amount in the monitor area, is monitored. On the other hand, when executing monitoring during development, the point in time (film removal time point) at which the intensity of the reflection light has ceased to vary is monitored.

The selection of a wavelength to be applied to the pattern at the time of monitoring will now be described. When monitoring a latent image, it is necessary to accurately monitor the film reduction amount by about ten and several nanometers as shown in FIG. 18.

Figure 20:
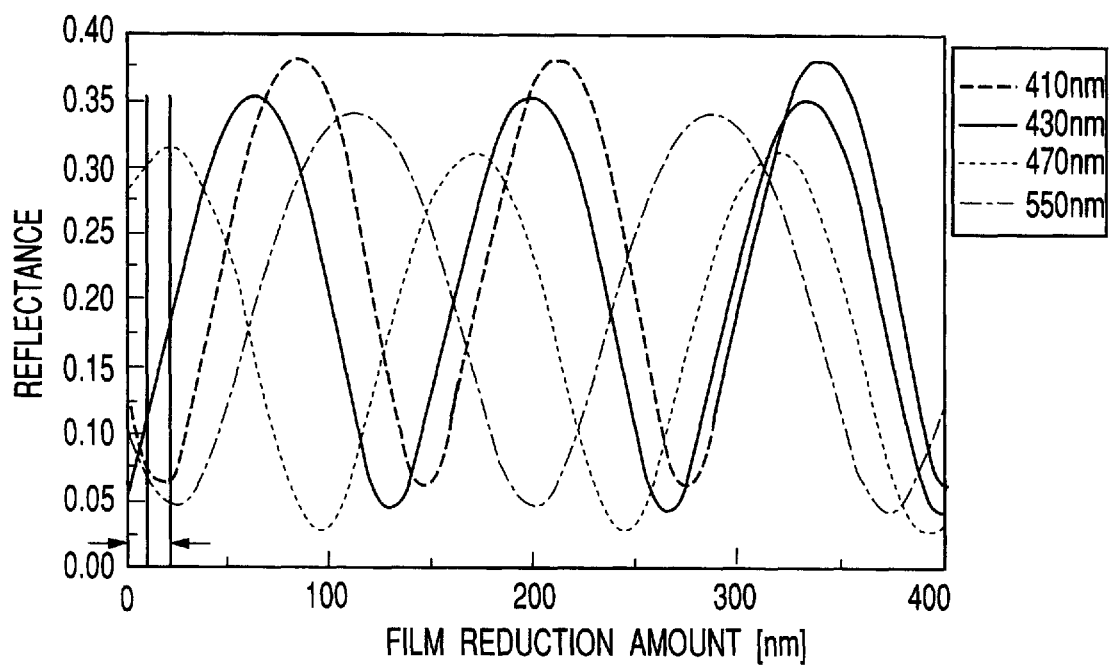
FIG. 20 is a view showing the relationship between the resist reduction amount and the reflectance, obtained when no developer is on the resist.

FIG. 20 shows the relationship between the film reduction amount of a resist and the reflectance of the resist where no developer is on the resist. The following is understood from the relationship. Where the film reduction amount is about ten and several nanometers (the range indicated by the arrows in the figure), if monitoring is executed using a wavelength of 430 nm, the reflectance varies simply and greatly in accordance with a change in the film thickness. This means that the film reduction amount, i.e. the exposure amount, can be accurately monitored on the basis of the intensity of reflection light.

As described above, the wavelength for monitoring is determined, in light of a resist/antireflection layer/ underlayer structure, so that the monitor pattern can show a maximum reflectance change for the film reduction amount of the monitor pattern in the vicinity of an appropriate exposure amount. Further, if a film thickness meter can be installed in the apparatus the film reduction amount may be monitored by the film thickness meter.

Figure 21:
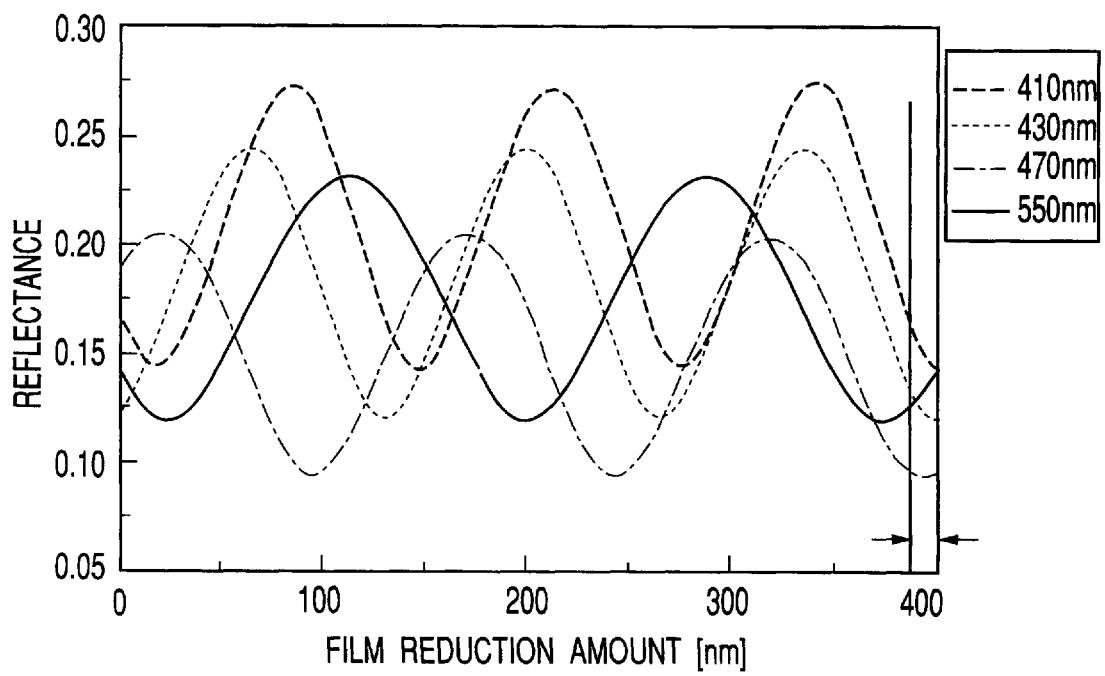
FIG. 21 is a view showing the relationship between the resist reduction amount and the reflectance, obtained when a developer is on the resist.

When executing monitoring during development, it is necessary to accurately count the period required for film removal, indicated by the ordinate in FIG. 19. FIG. 21 shows the relationship between the film reduction amount of a resist and the reflectance of the resist where a developer is on the resist. In order to accurately calculate the film removal period, it is desirable that the resist film should show a great reflectance change where the resist film thickness is zero (the film reduction amount is 400 nm) (i.e. in a range indicated by the arrows in FIG. 21). Accordingly, monitoring is executed using a wavelength of 550 nm. Thus, the wavelength for monitoring is determined, in light of a resist/anti-reflection layer/underlayer structure, so that the monitor pattern can show a maximum reflectance change where the resist film thickness is zero.

(Operation)

Referring now to the flowchart of FIG. 22, a sequence of development executed when the apparatus of the fourth embodiment is used will be described. After a wafer is transferred to the developing unit (step S1), the position of the notch of the wafer is detected to thereby adjust the angular position of the wafer (step S2). Subsequently, the monitor head is moved to a monitor area on a particular chip (i) (step S3), thereby detecting the position of the monitor area by pattern matching, and measuring the reflected light intensity of the monitor area (step S4). The number of chips in which the reflected light intensity of the monitor area has been measured is counted (step S5), and similar measurement is executed until the number of chips reaches n. After measuring the reflected light intensity of the monitor area of each of the number n of chips, a chip (k) to be monitored for the control of the developing period is determined from the mode of the measured reflected light intensities (step S6).

The development process is started (step S7), thereby moving the monitor head to the chip (k) and measuring a change in the reflected light intensity of the monitor area of the chip (step S8). From the reflected light intensity of the monitor area, the film removal period is calculated, thereby calculating an optimal developing period (step S9), and stopping development when the calculated developing period has passed (step S10). Instead of measuring the film removal period from a change in reflected light intensity, development may be stopped when the reflected light intensity has ceased to vary.

Figure 23:
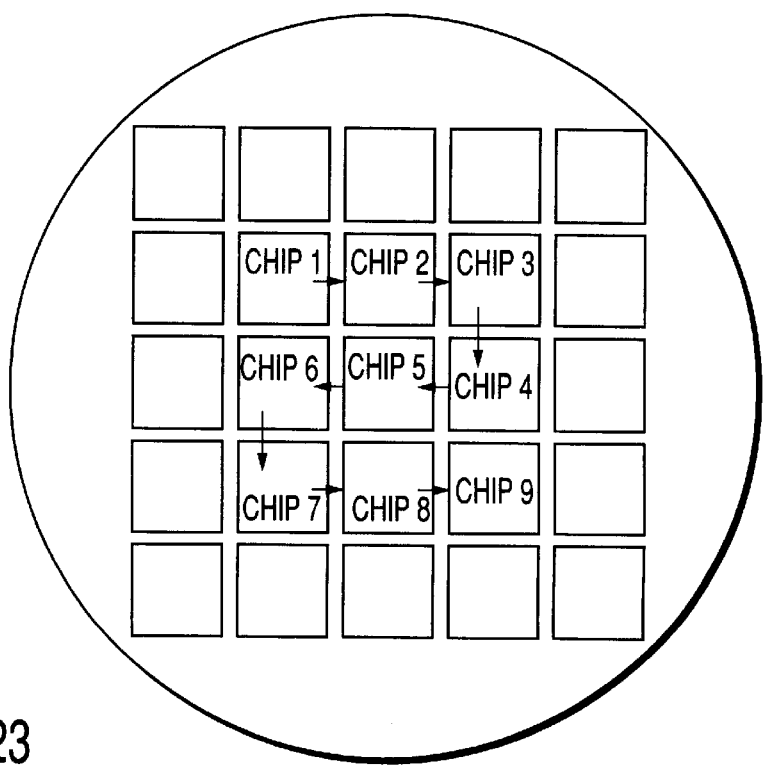
FIG. 23 is a view showing an example of the scanning order of nine chips to be monitored before development.

A further description will be given of the above-mentioned sequence of process, using actual experiment. results. FIG. 23 shows an example of a shot map, useful in explaining the order of scanning of nine chips to be monitored before development. As shown in the figure, chip 1, chip 2, chip 3, chip 4, chip 5, chip 6, chip 7, chip 8 and chip 9 are monitored in this order (step S3). The monitor head is moved so that the monitor area of each chip will be included in the screen of the monitor (step S4), thereby detecting the position of the monitor area by pattern matching, and measuring the intensity of light reflected from the monitor area (step S5).

Figure 24:
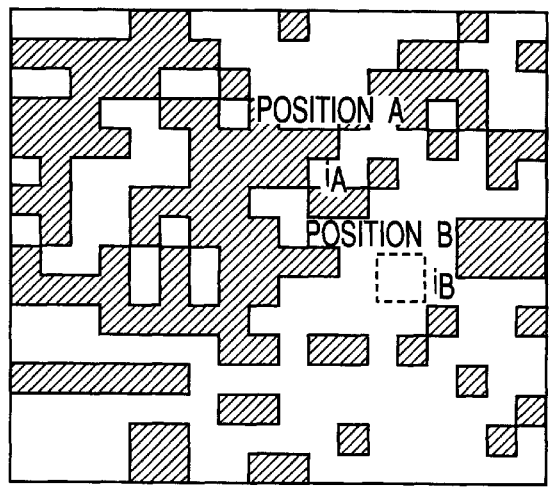
FIG. 24 is a view illustrating ununiform illumination on an observation area from a light source.

If the light source used for monitoring executes uniform illumination, or if all the monitor areas of the chips can be situated in the same position on the monitor screen, it suffices if the gradation on the screen of the CCD camera is monitored. Actually, however, an observation area is ununiformly illuminated as shown in FIG. 24. Further, since the monitor area is a square with one side of 20 $\mu$m (the observation area is a square with one side of 1 mm), and the position accuracy of the monitor head is not so high, it is almost impossible that all monitor areas will be situated in the exactly same position on the screen.

Figure 25:
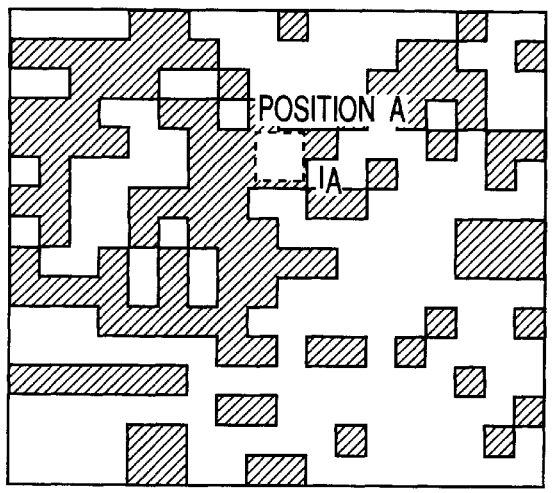
FIG. 25 is a view showing a state in which a monitor area is situated in a position A.
Figure 26:
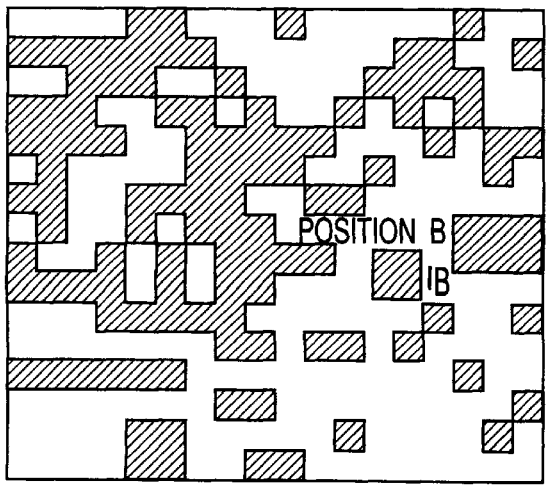
FIG. 26 is a view showing a state in which monitor area is situated in a position B.

For example, suppose that the same monitor area is situated in a dark portion (indicated by A) of ununiform illumination, and in a bright portion (indicated by B) thereof, as is shown in FIG. 24. In this case, the monitor area in the dark portion (FIG. 25) is seen darker than the monitor area in the bright portion (FIG. 26). Accordingly, sufficient accuracy cannot be obtained by the measurement of the gradation of the CCD camera screen.

To avoid the above, an image of ununiform illumination from the light source as shown in FIG. 24 is stored before monitoring each chip. When the monitor area is situated in the dark position A shown in FIG. 25, a value obtained by normalization based on the reflected light intensity of the position A in FIG. 24 is used as a normalized reflected light intensity ($I_A/i_A$) for the monitor area. On the other hand, when the monitor area is situated in the bright position B shown in FIG. 26, a value obtained by normalization based on the reflected light intensity of the position B in FIG. 24 is used as a normalized reflected light intensity ($I_B/i_B$) for the monitor area.

$I\alpha$ ($\alpha$: A or B) indicates the reflected light intensity of a monitor area, measured under uniform illumination, while ia ($\alpha$: A or B) indicates the reflected light intensity of the monitor area measured in the image of ununiform illumination shown in FIG. 24. If the gradation of the CCD camera screen contains background noise, the noise (Ibgnd) is measured in advance, and the normalized reflected light intensity is obtained by eliminating the background noise (in the case of the position A, for example, $(I_A-I_{bgnd})/(i_A-I_{bgnd})$).

Figures 27, 28:
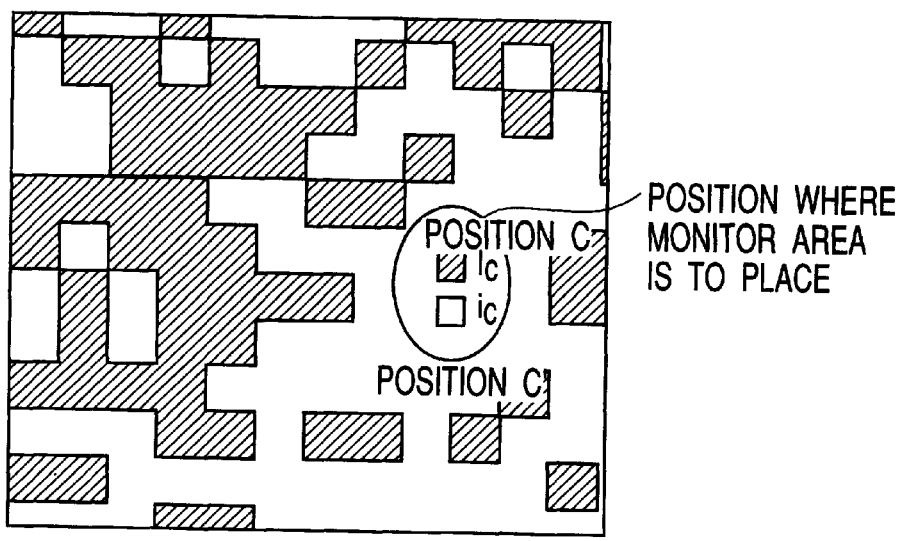
FIG. 27 is a view showing a case where the degree of ununiformity of illumination from a light source is not so high.
FIG. 28 is a view showing the measured reflected light intensities of monitor areas.

On the other hand, where, as shown in FIG. 27, the degree of illumination ununiformity of the light source is not so high, and monitor areas are situated in those portions (indicated by C) of illumination, which have the same brightness, the reflected light intensity used for normalization may consist of a reflected light intensity ($i_C$) obtained from an area near the monitor area.

FIG. 28 shows the normalized reflected light intensities of the aforementioned nine chips, which have been acquired from the actual experiments. A mode among these normalized intensities is 2.06, and hence the chip to be monitored during development is determined to be chip 4.

Figure 29:
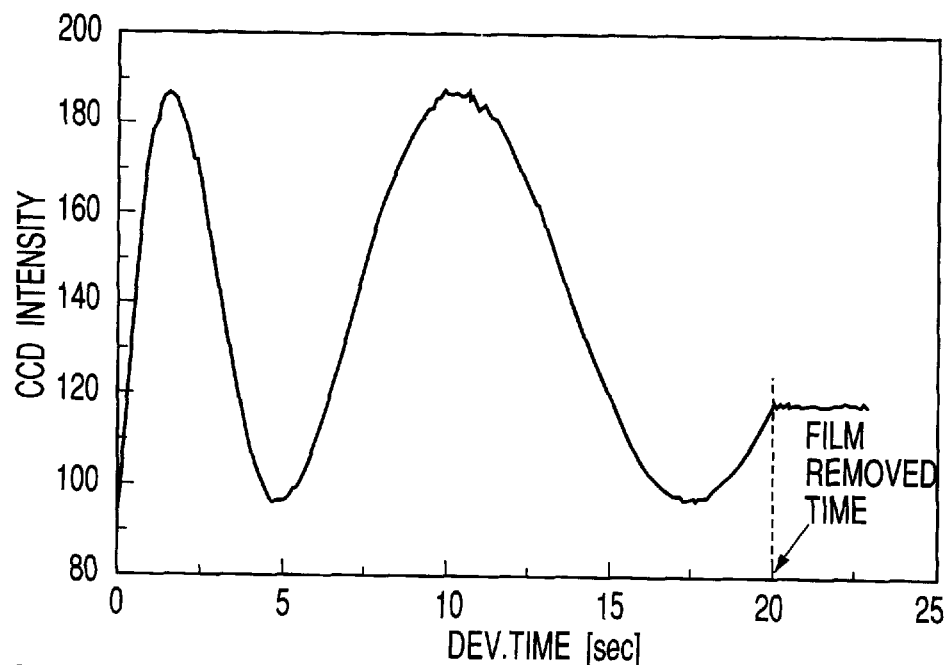
FIG. 29 is a graph showing variations in the reflected light intensity of a monitor area during development.
Figure 30:
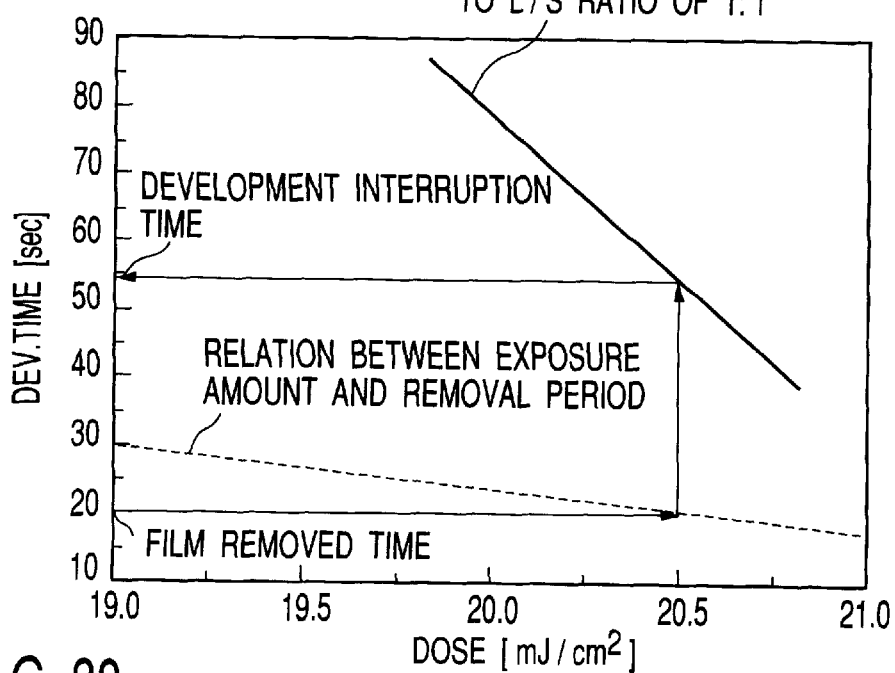
FIG. 30 is a view useful in explaining a method for calculating a development interrupting time from the film removal period of a monitor area.

A method for acquiring an appropriate developing period by monitoring the monitor area of chip 4 will be described. FIG. 29 shows changes in the reflected light intensity of the monitor area during development. It is understood from the changes in FIG. 29 that the period required for film removal is twenty seconds. On the other hand, FIG. 30 shows the relationship between the film removal period of the monitor area, and the period required for an L/S pattern with a width of 200 nm to have an L/S ratio of 1:1. On the basis of this relationship, the developing period (in this case, 55 seconds) is calculated. After the calculated developing period elapses, the development process is stopped.

Figure 31:
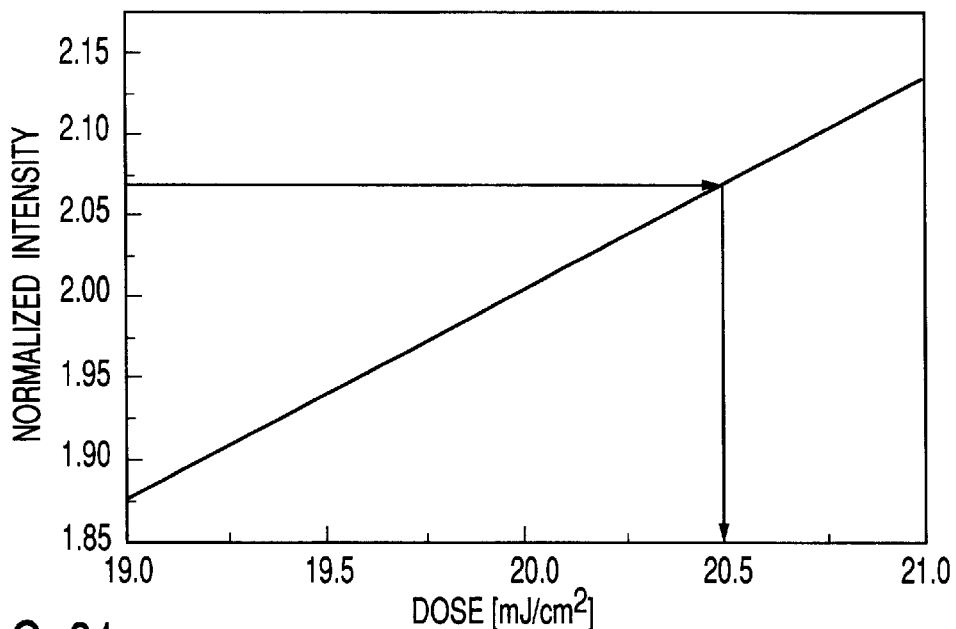
FIG. 31 is a view showing the relationship between the exposure amount and the reflected light intensity of a monitor area.
Figure 32:
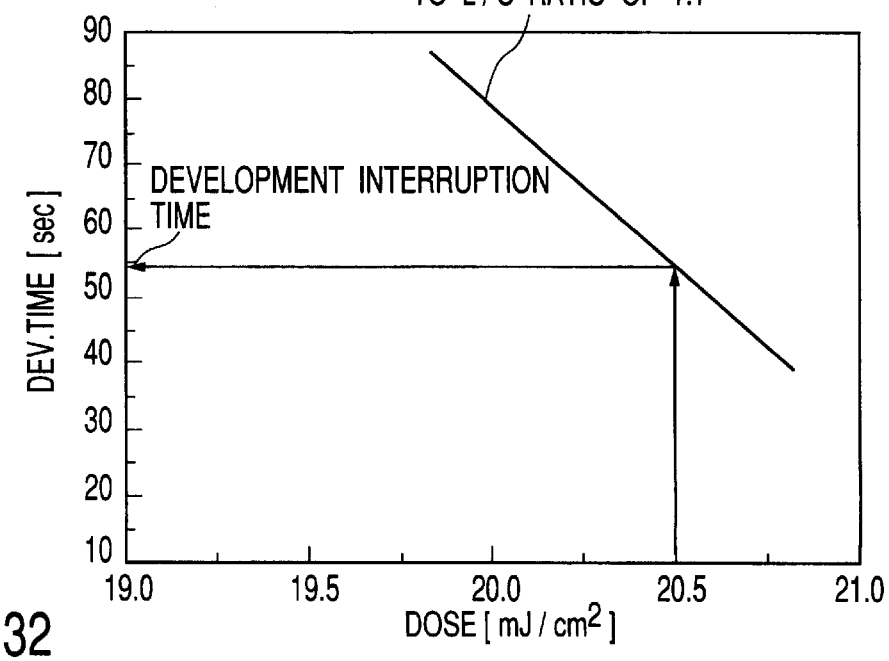
FIG. 32 is a view showing the relationship between the exposure amount and the time period required for forming an L/S pattern with a width of 200 nm to an L/S ratio of 1:1.

Although in the above case, the optimal developing period is calculated on the basis of the relationships shown in FIGS. 29 and 30, the manner of calculation of the period is not limited to this. The relationship between the normalized reflected light intensity and the amount of exposure (dose) is expressed as shown in FIG. 31, while the relationship between the exposure amount and the period required for an L/S pattern with a width of 200 nm to have an L/S ratio of 1:1 is as shown in FIG. 32. Accordingly, if same variations in development occur in different wafers, the optimal developing period can be obtained on the basis of the relationships shown in FIGS. 31 and 32. In this case, a higher one should be selected from the measurement accuracy obtained when the exposure amount is calculated from the normalized reflected light intensity, and the measurement accuracy obtained when the exposure amount is calculated from the film removal period.

(Advantages)

As stated above, when executing developing period control in order to reduce variations in size between different wafers, that one of the chips of each wafer, which has been processed under typical conditions, is extracted by measuring the reflected light intensity of the monitor area of each chip. The monitor area is monitored to calculate an optimal developing period from its film removal period and control the developing period, thereby significantly reducing variations in size between different wafers. As a result, the yield of the products greatly increases.

Further, when measuring the reflected light intensity, the use, as probing light, of light of a wavelength sensitive to a change in film thickness, and normalization of reflected light intensity in light of ununiform illumination from a light source enhance the measurement accuracy of reflected light intensity and the extraction accuracy of a typical chip. Moreover, when calculating the film removal period of a monitor pattern during development, the use, as probing light, of light of a wavelength whose reflected light intensity shows a significant change when the thickness of the pattern is zero significantly enhances the calculation accuracy of the film removal period and the size control accuracy.

(Fifth Embodiment)

(Structure)

Figure 33:
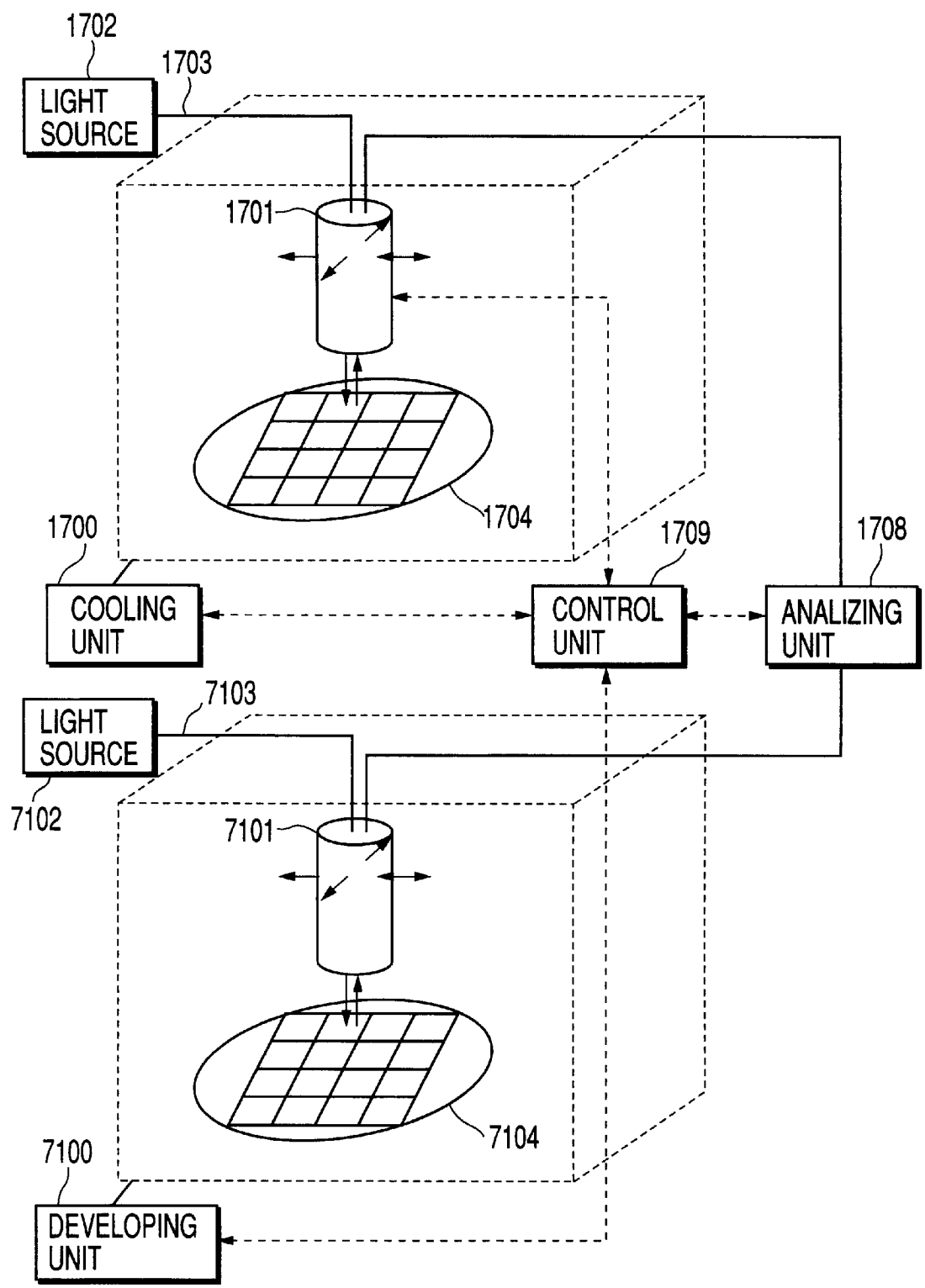
FIG. 33 is a schematic view showing a cooling unit and a developing unit employed in a fifth embodiment.

FIG. 33 illustrates the structure of a system used when a latent image is monitored in a cooling unit after post exposure baking (hereinafter referred to as a "PEB", and development is monitored in a developing unit. This embodiment differs from the fourth embodiment in that in the former, different monitor areas are used in monitoring of a latent image and monitoring of development.

A cooling unit 1700 contains a unit necessary for usual cooling, and also a monitor head 1701 for monitoring. The monitor head 1701 has a similar structure to that employed in the fourth embodiment, and is connected to a probing light source 1702 (which contains a plurality of narrow band filters that enable selection of a wavelength suitable for each condition), and also to a fiber 1703 for introducing light into the monitor head 1701. A collimator lens incorporated in the monitor head 1701 enables illumination of a wafer 1704 with parallel light of substantially a single color narrowed to a particular wavelength.

Light reflected from the wafer 1704 is detected by a CCD camera incorporated in the monitor head 1701. The monitor head 1701 is responsive to a signal from a control section 1709 in the apparatus for scanning the wafer 1704 so that it can monitor a monitor area 1706 provided in each of chips on the wafer. The monitor head 1701 is adapted to move to a position in which it can detect the monitor area of a predetermined chip, on the basis of a mask layout and an exposure shot map, then to pick up an image of the monitor area and to send the image to an analysis section 1708. Further, a developing unit 700 also contains a monitor head 701 as well as units for executing usual development and rinsing.

As shown in FIG. 34, the monitor area 1706 is provided in a mark area 1707 which is formed on the dicing line of the wafer. In the fourth embodiment, a mask pattern having a predetermined transmittance is provided in a monitor area and used for both monitoring of a latent image and monitoring during development. On the other hand, in the fifth embodiment, different monitor areas are used in respective monitoring processes, as is shown in FIG. 34.

The pattern to be used as a target pattern is an LS pattern with a width of 175 nm, and is provided in a device pattern area 1801. Further, the pattern used in the fourth embodiment and having a predetermined transmittance (pitch: 220 nm; transmittance: 46.9%) is provided in a latent image monitor area 1802. On the other hand, an L/S pattern with a width of 175 nm, which is the same as the target pattern, is provided in a development monitor area 1803. Although in this embodiment, a mask pattern having a predetermined transmittance or a device pattern itself is provided in each monitor area, a pattern sensitive to development may be used as in the case of a hole-type monitor pattern shown in FIG. 35A or a line-type monitor pattern shown in FIG. 35B. In FIGS. 35A and 35B, reference numeral 1901 denotes a light shield film.

In addition to patterns sensitive to development shown in FIGS. 35A and 35B, a pattern may be effective, which includes an element area formed by cutting part of a device pattern, or by cutting part of the device pattern and then partially varying the size. These patterns may be provided in any one of the latent image monitor area and the development monitor area. Furthermore, the monitor area may be a particular area of the device pattern area, instead of part of the mark area. It suffices if highest size accuracy can be obtained in each of the monitoring processes. For example, a line & space pattern in a memory cell section or a peripheral circuit section may be used as a monitor area.

In light of the fact that the resist film thickness is 400 nm, the anti-reflection layer thickness is 60 nm, and the exposure amount which permits an L/S pattern with a width of 175 nm to have an L/S ratio of 1:1 is 20.5 mJI/cm$^2$, light with a wavelength of 430 nm was used as probing light for monitoring a latent image, as in the fourth embodiment. On the other hand, for monitoring during development, it is desirable to employ a wavelength which causes a great change in the reflected light intensity of the monitor area in a case where the device pattern is formed into a desired size. In this case, a wavelength of 470 nm was employed. Thus, the wavelength to be employed for monitoring is determined so that it will show a significant reflectance change in a resist/anti-reflection layer/underlayer structure in a case where the device pattern is formed into a desired size.
(Operation)

Figure 36:
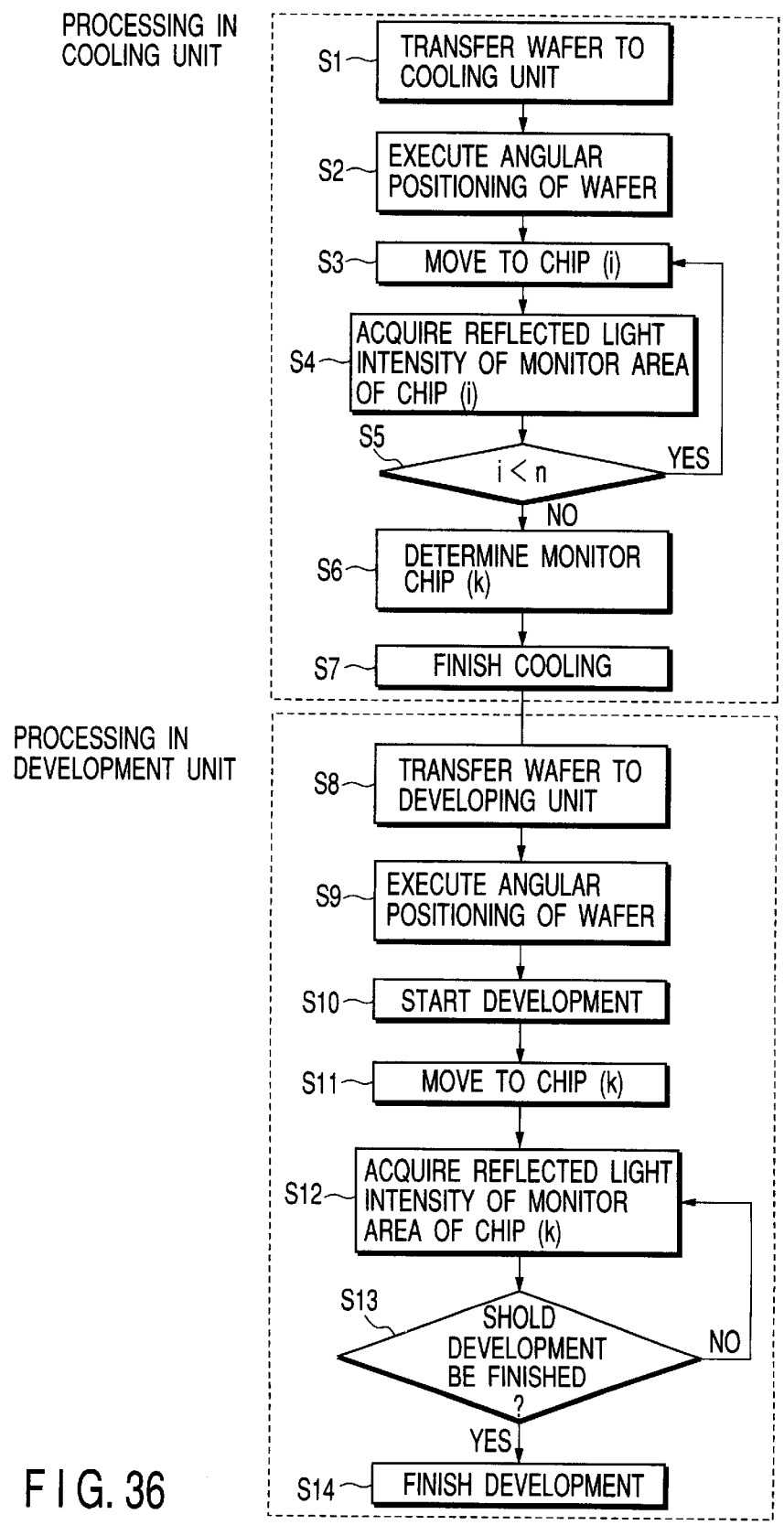
FIG. 36 is a flowchart illustrating a sequence of determination of a monitor chip and a sequence of development.

Referring then to the flowchart of FIG. 36, a description will be given of a sequence of cooling and developing processes executed where the fifth embodiment is employed. After a wafer is transferred to the cooling unit (step SI), the position of the notch of the wafer is detected to thereby adjust the angular position of the wafer (step S2). Subsequently, when the temperature of the wafer has become less than a predetermined value, the monitor head is moved to a latent image monitor area on a particular chip (i) (step S3), thereby detecting the position of the monitor area by pattern matching, and measuring the reflected light intensity of the monitor area (step S4).

The number of chips in which the reflected light intensity of the monitor area has been measured is counted (step S5), and similar measurement is executed until the number of chips reaches n. After measuring the reflected light intensity of the monitor area of each of the number n of chips, a chip (k) to be monitored for the control of the developing period is determined from the reflected light intensity measured at median (step S6).

When the cooling process has finished (step S7), the wafer is transferred into the developing unit (step S8), thereby detecting the position of the notch of the wafer, and adjusting the angular position of the wafer (step S9). After that, development is started (step S10), thereby moving the monitor head to the chip (k) (step S11) and measuring a change in the reflected light intensity of the development monitor area of the chip (step S12). From the reflected light intensity of the monitor area, an optimal development period is calculated (step S13), and stopping development when the calculated developing period has passed (step S14). The aforementioned predetermined temperature is a value at which PEB reaction substantially stops.

A further description will be given of the above- mentioned sequence of process, using actual experiment results. This embodiment employs the same shot map and the same order of scanning of nine chips to be subjected to monitoring of a latent image in the cooling unit, as those shown in FIG. 23 as in the fourth embodiment. In each of the chips, the monitor head is moved to a position in which the monitor area of each chip can be included in the screen of the CCD camera of the head, thereby detecting the position of the monitor area by pattern matching, and measuring reflected light intensity.

If the light source used for monitoring executes uniform illumination, or if all the monitor areas of the chips can be situated in the same position on the monitor screen, it suffices if the gradation on the screen of the CCD camera is monitored. Actually, however, an observation area is ununiformly illuminated as shown in FIG. 24. Further, since the monitor area is a square with one side of 20 μm (the observation area is a square with one side of 1 mm), and.the position accuracy of the monitor head is not so high, it is almost impossible that all monitor areas will be situated in the exactly same position on the screen.

For example, suppose that the same monitor area is situated in a dark portion (indicated by A) of ununiform illumination, and in a bright portion thereof (indicated by B), as is shown in FIG. 24. In this case, the monitor area in the dark portion (FIG. 25) is seen darker than the monitor area in the bright portion (FIG. 26). Accordingly, sufficient accuracy cannot be obtained by the measurement of the gradation of the CCD camera screen.

To avoid the above, an image of ununiform illumination from the light source as shown in FIG. 24 is stored before monitoring each chip. When the monitor area is situated in the dark position A shown in FIG. 25, a value obtained by normalization based on the reflected light intensity of the position A in FIG. 24 is used as a normalized reflected light intensity ($I_A/i_A$) for the monitor area. On the other hand, when the monitor area is situated in the bright position B shown in FIG. 26, a value obtained by normalization based on the reflected light intensity of the position B in FIG. 24 is used as a normalized reflected light intensity ($I_B/i_B$) for the monitor area.

Iα (α: A or B) indicates the reflected light intensity of a monitor area, measured under uniform illumination, while iα (α: A or B) indicates the reflected light intensity of the monitor area measured under ununiform illumination as shown in FIG. 24. If the gradation of the CCD camera screen contains background noise, the noise ($I_{bgnd}$) is measured in advance, and the normalized reflected light intensity is obtained by eliminating the background noise (in the case of the position A, for example, $(I_A-I_{bgnd})/(i_A-I_{bgnd})$.

On the other hand, where, as shown in FIG. 27, the degree of illumination of the light source is not so high, and monitor areas are situated in those portions (indicated by C) of illumination, which have the same brightness, the reflected light intensity used for normalization may consist of a reflected light intensity ($i_C$) obtained from an area near the monitor area.

FIG. 37 shows the normalized reflected light intensities of the aforementioned nine chips, which were acquired from the actual experiments. The median (the middle value) of these normalized intensities is 2.08, and the chip to be monitored during development is determined to be chip 2. If there are random variations in reflected light intensity of latent monitoring area between chips, a typical chip should be selected on the basis of the average value or the median value of the reflected light intensities. Further, where most chips have the same reflected light intensity, and some other chips have different reflected light intensities, the typical chip should be selected on the basis of the mode value. It is desirable that the type of variations should be examined in advance and an optimal method be selected on the basis of the examination result.

A description will be given of a method for monitoring the development monitor area of chip 2 and determining an optimal developing period. FIG. 38 shows variations in reflected light intensity in a development monitor area. In this figure, the normalized reflected light intensity indicated by the ordinate is that obtained by normalizing the reflected light intensity of the monitor area on the basis of the reflected light intensity of the same area acquired in advance (for example, normalizing the reflected light intensity of the position A in FIG. 25 on the basis of that of the position A in FIG. 26), as in the fourth embodiment. Where a pattern is provided in a development monitor area as in this embodiment, the reflected light intensity during the latter half of development varies substantially linearly as shown in FIG. 38. In this case, the reflected light intensity (desired reflected light intensity) of the monitor area, which is obtained when the device pattern is formed to a desired size, is measured in advance, and the time at which the reflected light intensity of the monitor area has come to the desired value as shown in FIG. 38 is determined a development interruption time.

Figure 39A:
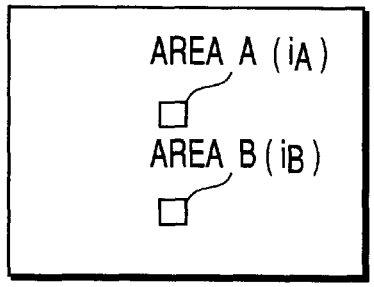
FIGS. 39A and 39B are views illustrating a method for normalization which considers variations with time in reflected light intensity.
Figure 39B:
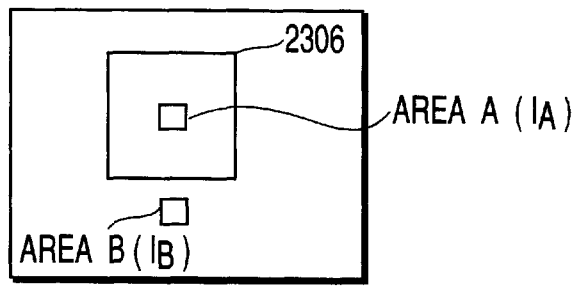

A reflected light intensity change in the development monitor area (in which a pattern is to be formed) employed in this embodiment is smaller than that in the monitor area (in which film reduction will occur) employed in the fourth embodiment. Accordingly, the reflected light intensity change in this embodiment is greatly influenced by noise due to variations in light source and/or developer surface with lapse of time. Therefore, in this case, normalization is executed in light of variations in reflected light intensity with time. FIGS. 39A and 39B are views useful in explaining this. An image shown in FIG. 39A and employed for normalization is used to beforehand measure the illumination ununiformity of a light source, and is an image of a non-exposed area of a resist. An image shown in FIG. 39B and employed for obtaining a reflected light intensity includes the monitor area whose reflected light intensity change is to be measured. Normalization stated above is executed for correcting the illumination ununiformity of the light source, and obtained by setting the reflected light intensity of an area A in the monitor area at $I_A/i_A$. Further, to correct variations in reflected light intensity with time, the reflected light intensity ($I_B/i_B$) of a non-exposed area B near the monitor area is determined, and normalization is executed on the basis of this reflected light intensity ($I_B/i_B$).

The normalized reflected light intensity IST is given by $$I_{st} = \left(\frac{I_A}{i_A}\right) / \left(\frac{I_B}{i_B}\right) \quad (4)$$

Figure 40:
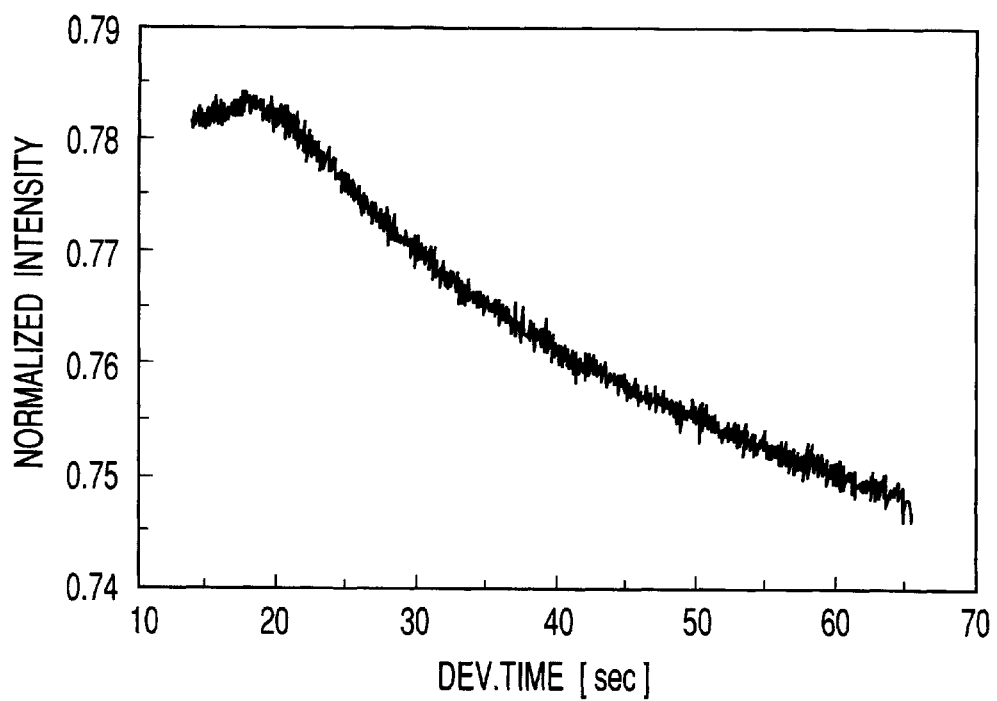
FIG. 40 is a graph showing variations in normalized reflected light intensity obtained in light of variations with time.

FIG. 40 illustrates variations in reflected light intensity obtained in light of variations with time. It is understood from the comparison between FIGS. 40 and 38 that noise is suppressed as a result of considering variations with time. This being so, this normalization method was employed to obtain the reflected light intensity of a monitor pattern during development. If the gradation on the CCD camera screen contains background noise, normalization may be executed by subtracting background noise ($I_{bgnd}$) as shown in the following equation. Further, although in the fourth embodiment, the reflected light intensity during development is used as the gradation of the CCD camera screen, the method given by the following equation may be used since it minimizes noise contained in a change in reflected light intensity.

$$I_{st} = \left(\frac{I_A - I_{bgnd}}{i_A - I_{bgnd}}\right) / \left(\frac{I_B - I_{bgnd}}{i_B - I_{bgnd}}\right) \quad (5)$$

FIG. 41 illustrates the relationship between the line size of an L/S pattern with a width of 175 nm and the normalized reflected light intensity of a monitor pattern necessary to determine the reflected light intensity of the pattern when stopping the development process. From this relationship, the threshold value of the reflected light intensity is determined to be 0.746. Therefore, when actually executing development, the normalized reflected light intensity is measured in light of variations with time shown in FIG. 40, and development is stopped when the reflected light intensity has reached 0.746.

If a time point at which the interruption of development is actually executed (i.e. a rinsing liquid is actually supplied) is slightly after a time point at which the interruption of development should be started, the reflected light intensity at a time point after by the time difference is estimated from changes in reflected light intensity, and development is stopped when the estimated reflected light intensity has reached a desired value.

The variations in size between wafers are reduced in the following manner. When executing development time control, a chip included in a wafer and processed under typical conditions is extracted by measuring the reflected light intensity of each latent image monitor area. Then, the development monitor area of the extracted chip is monitored during development, thereby calculating an optimal developing period for controlling the developing period, from variations in reflected light intensity in the development monitor area. As a result, variations in size between wafers can be significantly reduced, and the yield of the products can be greatly enhanced.

Moreover, the use of a wavelength sensitive to a film thickness change when measuring the reflected light intensity, and the normalization of the reflected light intensity in light of the illumination ununiformity of a light source enhance the measurement accuracy of reflected light intensity, and also enhance the extraction accuracy of a typical chip. In addition, when measuring variations in reflected light intensity during development, reflected light intensity normalization is executed in light of not only the illumination ununiformity of a light source but also variations with time, thereby enhancing the measurement accuracy of reflected light intensity and also size control accuracy.

The invention is not limited to the above embodiment. Although in this embodiment, the reflected light intensity is corrected by normalizing the illumination ununiformity of a light source or variations in reflected light intensity with time, the above-described normalization method is also applicable to a case where the reflected light intensity of another monitor area is normalized.

(Sixth Embodiment)
(Structure)

The developing unit employed in a sixth embodiment is basically similar to that shown in FIG. 17 and employed in the fourth embodiment. This embodiment relates to a case where the thickness of underlayer varies within a certain range but how it varies cannot be determined, and where different monitor areas are subjected to both monitoring of a latent image and monitoring during development.

A monitor area 760 is provided in a mark area and includes a latent image monitor area and a development monitor area. A mask pattern for forming the latent image monitor area consists of a pattern having a predetermined transmittance, while a mask pattern for forming the development monitor area consists of an L/S pattern with a width of 200 nm as a device pattern. The mask pattern of the predetermined transmittance is a regular pattern with a pitch which permits only zero-order light to reach the wafer, and is produced by appropriately setting the ratio between the to-be-removed portion and the to-be-left portion of the mask pattern.

The condition which permits only zero-order light to reach the wafer is given by the formula (2). In this case, 220 nm (this is a value on a wafer) is employed as the pitch of the mask pattern. The use of this pitch enables the formation of the mask pattern with the predetermined transmittance. Furthermore, the film reduction amount of the monitor area when forming a latent image is determined in accordance with the exposure amount from the formula (3), if the mask pattern of the predetermined transmittance is used.

The exposure amount and the film reduction amount are proportional to each other when the transmittance of the mask pattern for forming the monitor area is set at 46.9%, as is shown in FIG. 18. In this case, the conditions such as pattern size, resist thickness, anti-reflection layer thickness, etc. are identical to those employed in the fourth embodiment. From the proportional relationship, the exposure amount can be determined from the film reduction amount in the monitor area when executing monitoring of a latent image.

A description will now be given of how to calculate the film reduction amount during monitoring of a latent image. Suppose that an oxide film is provided under resist and anti-reflection layer, the range of the thickness of the oxide film is ±5 nm, and the middle value of the thickness is 310 nm.

FIG. 42 shows the relationship between the resist film reduction amount and the normalized reflected light intensity, obtained when the thickness of the underlayer is set at 305 nm, 310 nm and 315 nm. The reflected light intensity is normalized on the basis of the initial film thickness of the resist (which is assumed at a film reduction amount of 0). The monitoring wavelength is set at 550 nm. This is because if the middle film thickness is 310 nm, the reflected light intensity shows a significant change in the vicinity of a film reduction amount (10 nm) to be measured.

Figure 43:
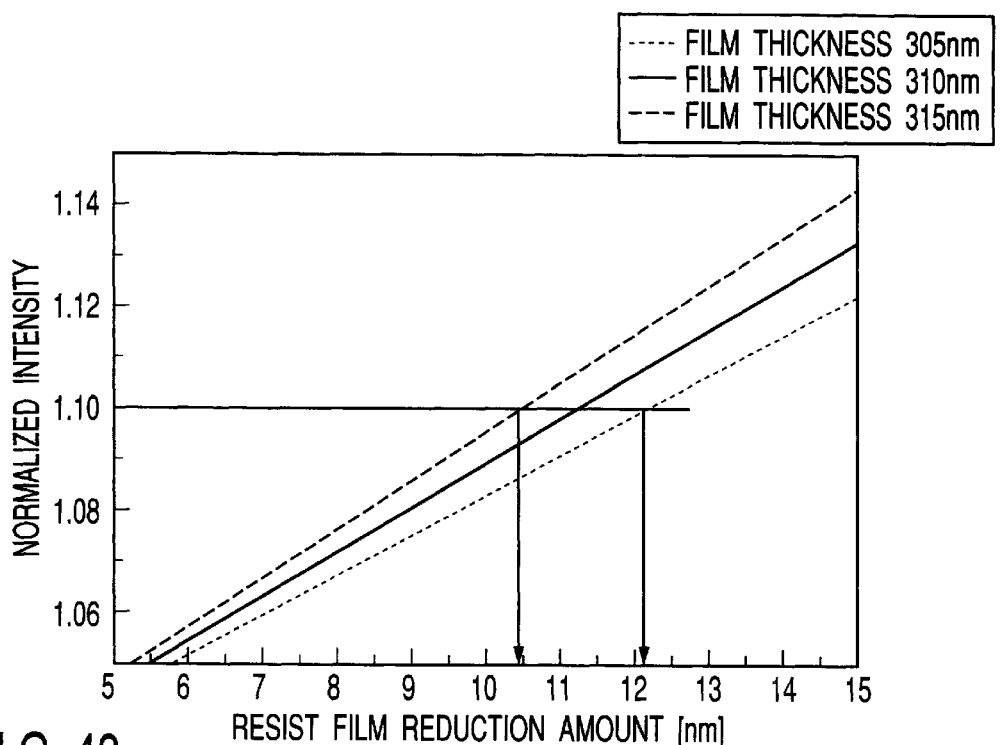
FIG. 43 is an enlarged view of a resist film reduction amount range including a reduction amount of 10 nm.

FIG. 43 is an enlarged view showing values that include the to-be-measured resist film reduction amount of 10 nm and values near it. If, for example, the normalized reflected light intensity is 1.1, the film thickness measurement error is about 3 nm when the thickness of the underlayer ranges from 305 nm to 315 nm. It is understood from FIG. 18 that the measurement error of 3 nm is too great, which makes it impossible to accurately calculate the exposure amount. Accordingly, where the underlayer does not have a uniform thickness, the film thickness of the resist cannot be measured accurately if it is monitored using a single wavelength.

A plurality of thicknesses can be accurately measured by applying a plurality of light beams of different wavelengths thereto, measuring respective reflectances, and referring to the prestored relationship between reflectances and the thicknesses of the resist underlayer. This method can achieve most accurate measurement of a plurality of thicknesses, but requires a great amount of time. In the actual process of manufacture, however, the thicknesses of the monitor areas of a plurality of chips (about 10 chips) must be measured in about 30 seconds at maximum. Therefore, the method cannot be employed.

Figure 44:
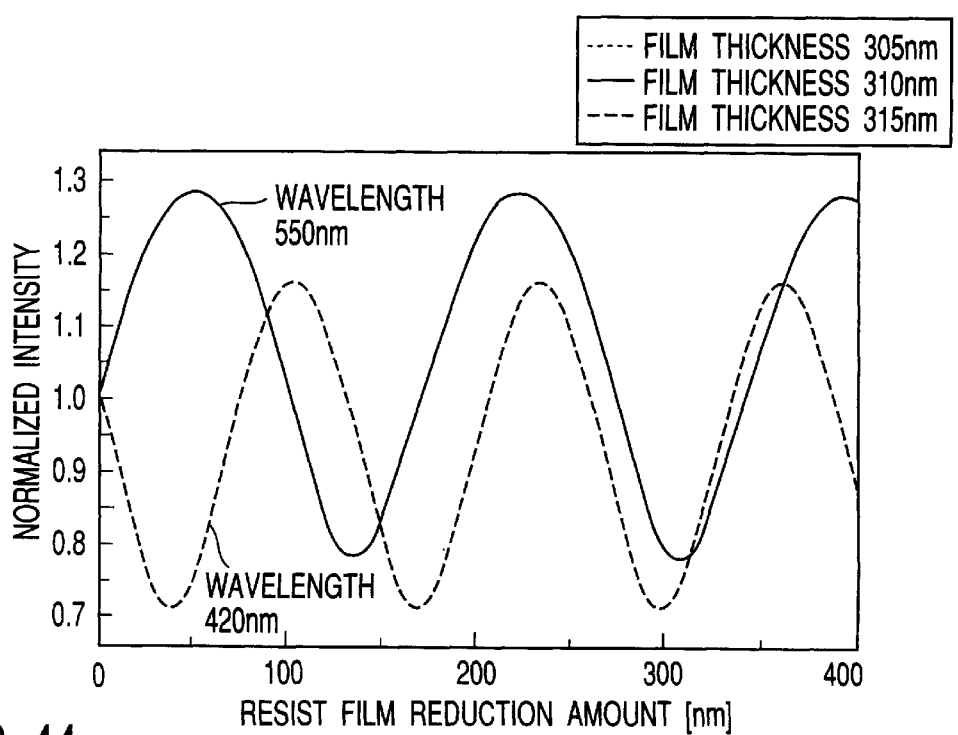
FIG. 44 is a graph showing the relationship necessary for a wavelength to be used for monitoring.
Figure 45:
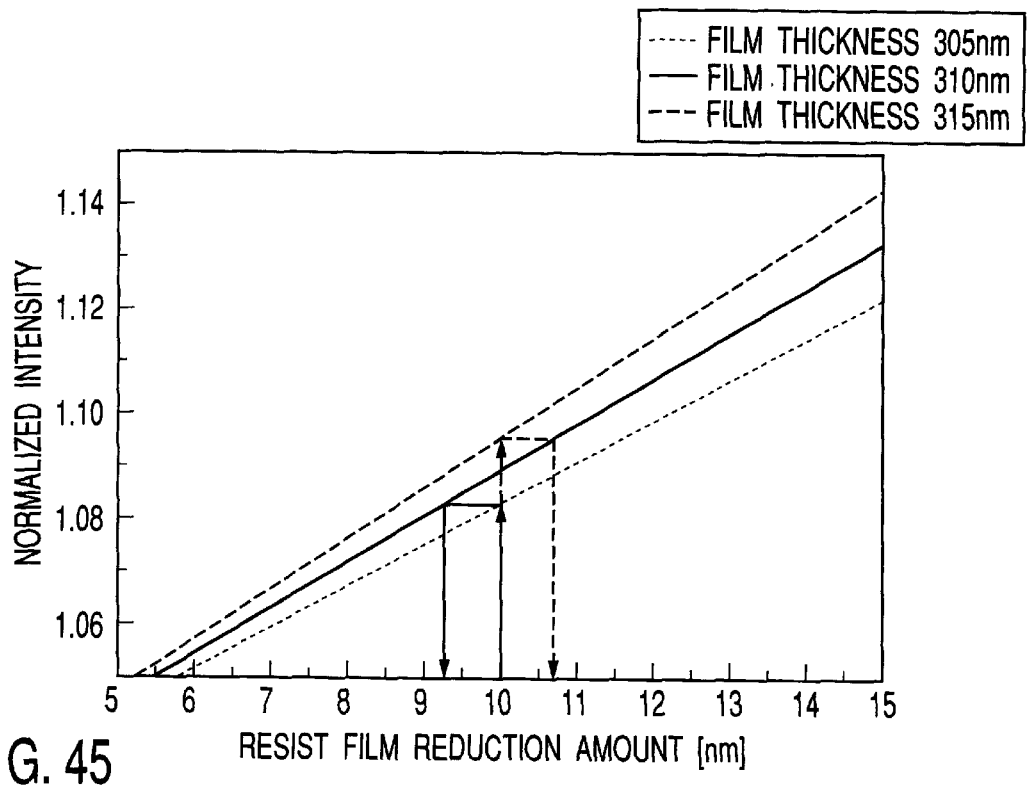
FIG. 45 is a graph showing the relationship between the resist film reduction amount and the normalized reflected light intensity (wavelength: 550 nm)
Figure 46:
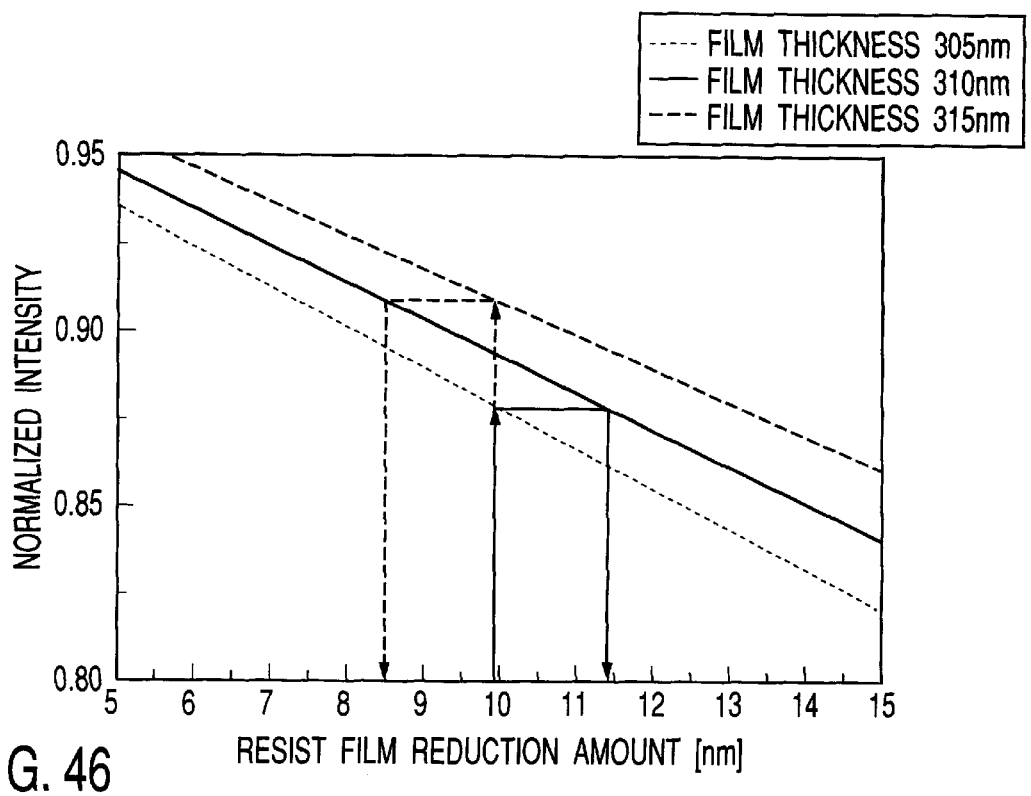
FIG. 46 is a graph showing the relationship between the resist film reduction amount and the normalized reflected light intensity (wavelength: 420 nm)

Instead of the above method, a method that uses two wavelengths can be employed. This method will be described. This method employs two wavelengths as shown in FIG. 44, which show points of inflection where the resist film has an initial thickness, and have reverse inclinations. In the case of FIG. 44, wavelengths of 550 nm and 420 nm are used. A description will be given of a method for calculating the thickness of the resist film when the thickness of an oxide film as the underlayer varies, supposing that the reduction amount of the resist film is 10 nm. FIG. 45 shows the relationship between the reduction amount of the resist film and the normalized reflected-light intensity when using the wavelength of 550 nm. FIG. 46 shows the relationship between the reduction amount of the resist film and the normalized reflected-light intensity when using the wavelength of 420 nm.

In each of the above cases, the resist film thickness is calculated using the middle value (310 nm) of the underlayer thickness. Where the underlayer thickness is 305 nm, the resist film reduction amount is determined to be 9.25 nm as indicated by the solid-line arrow in FIG. 45 when using the wavelength of 550 nm. On the other hand, when using the wavelength of 420 nm, the resist film reduction amount is determined to be 11.5 nm in the same case as above, as is indicated by the solid-line arrow in FIG. 46. In other words, 9.25 nm and 11.5 nm deviate by 0.75 nm and 1.5 nm from the actual value of 10 nm, respectively, and hence the deviation ratio is 0.75:1.5=1:2. Supposing that the measured thickness of the resist film is $d_{550}$ when using the wavelength of 550 nm, the measured thickness of the same is $d_{420}$ when using the wavelength of 420 nm, and the deviation ratio is m : n, the actual thickness d is given by the following equation:

$$d = (n \times d_{550} + m \times d_{420})/(m+n)$$

Using this equation, the actual thickness of the resist film is determined to be 390 nm irrespective of whether the underlayer thickness is 305 nm (as indicated by the solid line in FIGS. 45 and 46) or 315 nm (as indicated by the broken line in FIGS. 45 and 46).

A description will now be given of the manner of calculating a development finish time by executing monitoring during development. FIG. 47 shows examples of variations in the reflected light intensity of the L/S pattern with the width of 200 nm used as the development monitor pattern in this embodiment. In this case, a wavelength of 550 nm that enables acquisition of a great change in reflected light intensity during development is used as a monitoring wavelength for determining the development finish time. This figure shows an intensity change obtained when an oxide film as the underlayer has a thickness of 310 nm (middle value). Further, it is known in advance that a normalized reflected-light intensity of 0.88 (normalization was executed on the basis of the reflected light intensity of an unexposed portion of the resist film) enables the formation of the resist film to a desired size. Accordingly, if the development monitor pattern shows intensity variations as shown in FIG. 47, the development process should be finished when the normalized reflected light intensity has reached 0.88 (thirty four seconds have elapsed).

However, where the underlayer thickness is 305 nm or 315 nm, the reflected light intensity entirely shifts as shown in FIG. 48. Therefore, it is possible that the desired size will not be obtained even if the development process is finished at a threshold value of 0.88. This means that it is necessary to measure the thickness of the oxide film during development. In this case, the thickness of the oxide film is measured from the reflected light intensity of that portion of the oxide film, which was normalized on the basis of the reflected light intensity of a resist unexposed portion and situated where the remaining resist film is 0. To accurately measure the thickness of the oxide film, it is desirable that the normalized reflected light intensity should greatly vary when the remaining resist film is 0.

Figure 49:
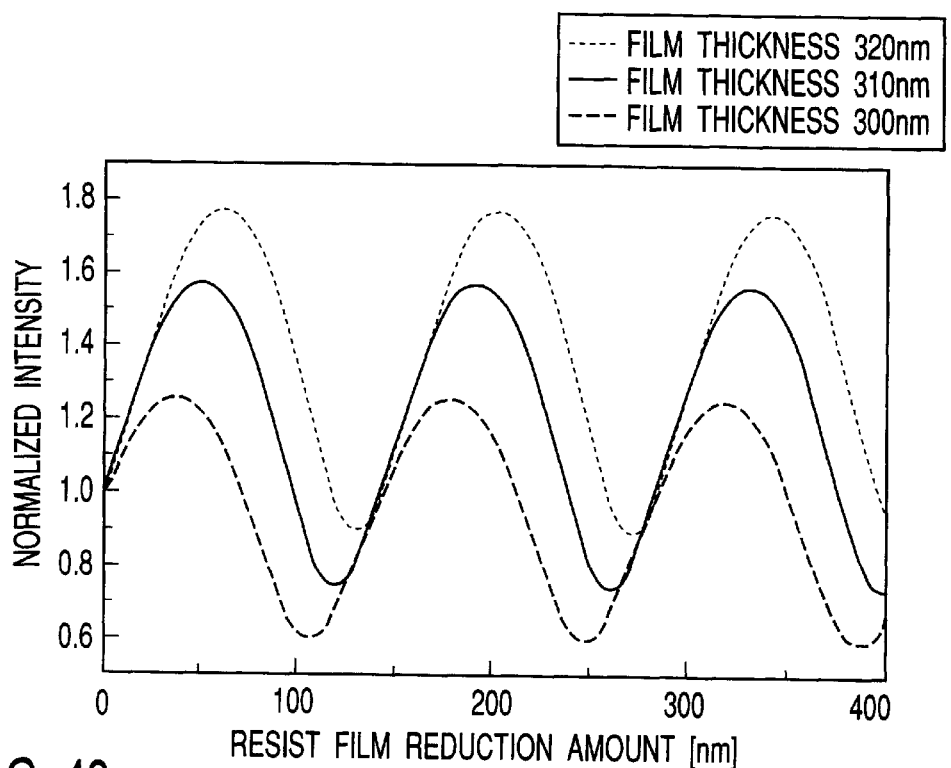
FIG. 49 is a graph showing the relationship between the resist film reduction amount and the normalized reflected light intensity, which is obtained when the underlayer has an ununiform thickness (wavelength: 450 nm)
Figure 50:
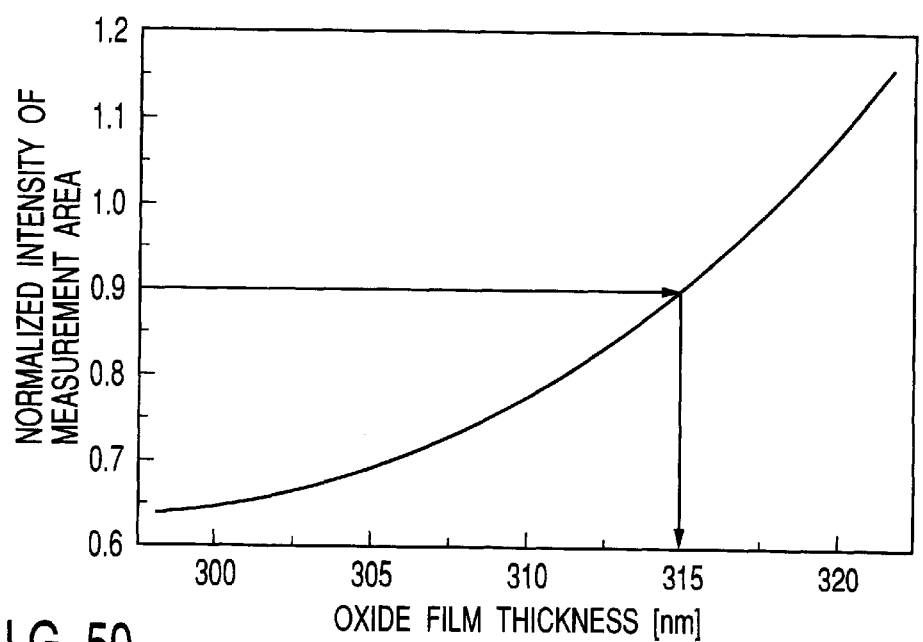
FIG. 50 is a graph showing the relationship between the oxide film thickness and the normalized reflected light intensity of an area where the remaining resist film is 0 (wavelength: 450 nm)
Figures 51, 52:
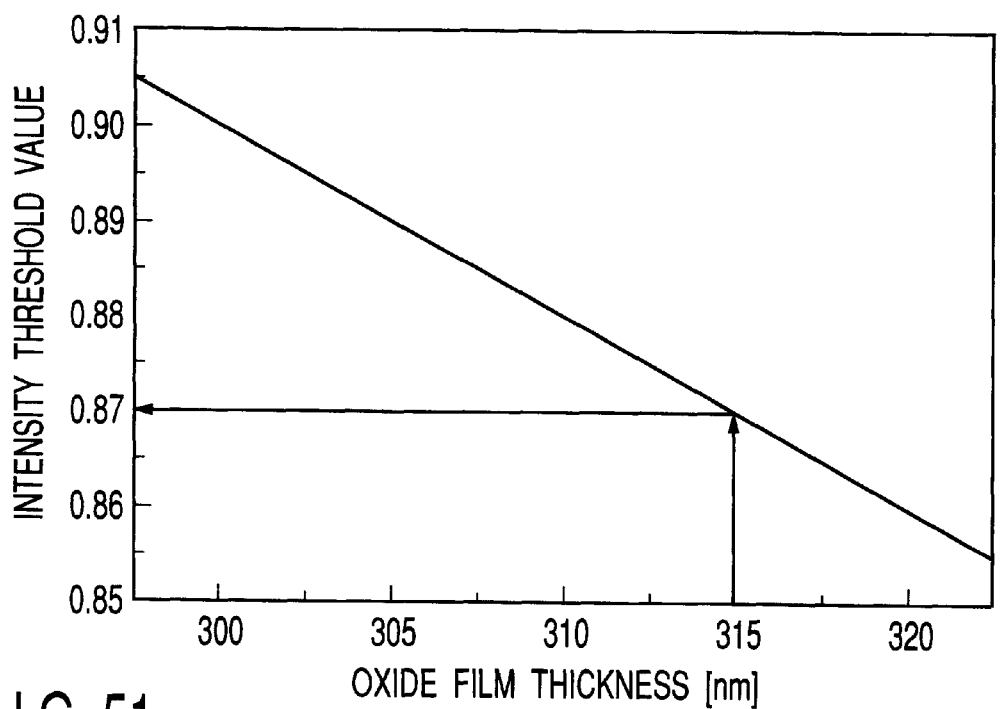
FIG. 51 is a graph showing the relationship between the oxide film thickness and the reflected light intensity threshold value (wavelength: 550 nm)
FIG. 52 is a view showing the measured film thicknesses of monitor areas in which latent images are formed.

FIG. 49 shows the relationship between the resist film reduction amount and the normalized reflected light intensity, obtained when monitoring is executed using light with a wavelength of 450 nm. It is understood from this figure that the normalized reflected light intensity greatly varies when the resist film reduction amount is 400 nm (the remaining film is 0). FIG. 50 shows the actual relationship between the thickness of the oxide film and the normalized reflected light intensity obtained where the remaining resist film is 0. The thickness of the oxide film as the underlayer can be measured, during development, by measuring the normalized reflected light intensity obtained where the remaining resist film is 0, using light with a wavelength of 450 nm on the basis of the relationship shown in FIG. 50. Accordingly, if the relationship between the thickness of the underlayer oxide film and the threshold value of the reflected light intensity at the termination of development is predetermined as shown in FIG. 51, the threshold value of the reflected light intensity at the termination of development can be calculated from the measured thickness of the underlayer oxide film.

(Operation)

The sequence of development in this embodiment is basically similar to that described with reference to the flowchart of FIG. 22. FIG. 52 illustrates actually measured thicknesses, obtained using two wavelengths 550 nm and 420 nm, of those resist films of nine chips in which latent images are formed. From this figure, the most-frequent film thickness (mode) was 11.5 nm, and the chip to be monitored during development was determined to be chip 6.

A method for monitoring the monitor area of a chip 704 to obtain an optimal developing period will be described. First, the normalized reflected light intensity of an area where the remaining resist film was 0 was measured at the beginning of development, using light with the wavelength of 450 nm. The measurement result was 0.9. Accordingly, the thickness of the oxide film is 315 nm from FIG. 50. Subsequently, from FIG. 51, the threshold value of the reflected light intensity was 0.87. After that, variations in the normalized reflected light intensity of the L/S pattern with a width of 200 nm were monitored using the measurement wavelength of 550 nm, thereby obtaining measurement results as shown in FIG. 53. From FIG. 53, it is understood that the development process should be finished in twenty-seven seconds.

(Advantages)

As described above, in this embodiment, in order to reduce variations in size between wafers, that one of wafers, which has been processed under typical conditions, is extracted, before execution of development time control, by measuring the film thicknesses of the latent monitor areas of the chips. Then, development is started, and the thickness of the underlayer of the chip is measured before monitoring the reflected light intensity of the monitor area of the chip, thereby determining the threshold value of the reflected light intensity. The developing period is controlled on the basis of the determined threshold value, thereby significantly reducing variations in size between wafers. As a result, the yield of the products can be greatly enhanced.

Further, when measuring the thickness of a resist film in which a latent image is formed, the film thickness can be measured in a short time by using, as probing light beams, two light beams which have different wavelengths sensitive to variations in film thickness and have phases differing from each other by 180 degrees in a film thickness range that includes a to-be-measured thickness. Moreover, to determine the threshold value of the reflected light intensity in the first half of development, the thickness of the underlayer is measured by measuring the reflected light intensity an area where the remaining resist film is 0, thereby determining the threshold value of the reflected light intensity of a development monitor pattern. As a result, the accuracy of determining the developing period is enhanced, and variations in size between wafers can be significantly reduced.

(Seventh Embodiment)
(Structure)

A developing unit used in a seventh embodiment is basically similar to that of the fourth embodiment shown in FIG. 17. This embodiment relates to a case where different monitor areas are used for monitoring of a latent image and monitoring during development when the underlayer has thicknesses falling within a certain range, and the range is known before the developing process.

In the seventh embodiment, the monitor areas are provided in the mark area as in the sixth embodiment, and comprise a latent image monitor area and a development monitor area. Also in this embodiment, a pattern with a transmittance of 46.9% is used as a latent image monitor pattern, and its thickness is measured.

A description will be first given of how to measure a film reduction amount when monitoring a latent image. Conditions such as the thickness of an oxide film under the resist and the anti-reflection layer film are arranged identical to those employed in the sixth embodiment. In the sixth embodiment, the thickness of the underlayer oxide film is unknown, whereas in the seventh embodiment, the thickness of the oxide film is measured before the developing process (for example, in the CMP process), and information on the measurement result is sent to a monitor unit. Accordingly, the thickness of the resist film is measured using one wavelength. If the thickness of the oxide film is 310 nm, the resist film thickness is obtained on the basis of the relationship indicated by the solid line in FIG. 43. In other words, the resist film thickness is obtained from the relationship between the normalized reflected light intensity and a resist film reduction amount corresponding to the measured thickness of the oxide film.

A description will be then given of how to determine the development finishing time by monitoring during development. In this embodiment, a special point of variations in the reflected light intensity of the development monitor area is noted, thereby determining an optimal developing period. FIG. 54 shows variations, during development, in the reflected light intensity of an L/S pattern with a width of 200 nm located in the development monitor area (wavelength: 550 nm). In the variations in reflected light intensity shown in FIG. 54, the mode of reflected light intensity variations changes at a point in time about fifteen seconds after the start of development. Specifically, before fifteen seconds elapse after the start of development, the exposed portions of the resist pattern are developed in the thickness direction. When fifteen seconds have elapsed, side portions of the resist pattern are gradually developed. The optimal developing period is calculated on the basis of a point (the pattern removed point in time in FIG. 54) at which the mode of reflected light intensity variations changes.

FIG. 55 shows the relationship between the exposure amount (dose) and the period required for pattern removal. From this relationship, it is understood that the measurement of the pattern removal period enables the determination of the exposure amount. Accordingly, where the relationship between the exposure amount and the optimal developing period is determined in advance, the optimal developing period is obtained from the pattern removal period.

Figure 57:
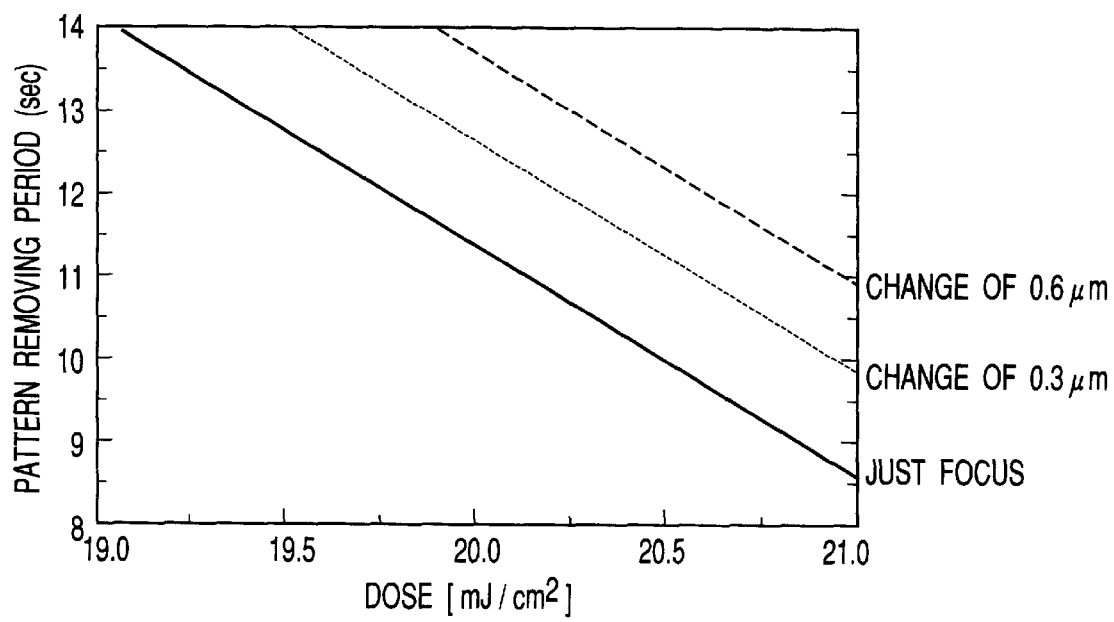
FIG. 57 is a graph showing the relationship between the exposure amount and the pattern removal period, obtained when the focus varies.

However, when defocusing has occurred, if data for a just focusing state is used to obtain the exposure amount from the pattern removal period, an accurate exposure amount (dose) cannot be determined, as is understood from FIG. 57. Therefore, in this case, a pattern which is not influenced by the defocusing state, i.e. a pattern having a particular transmittance (used for monitoring a latent image), is monitored as well.

Figure 58:
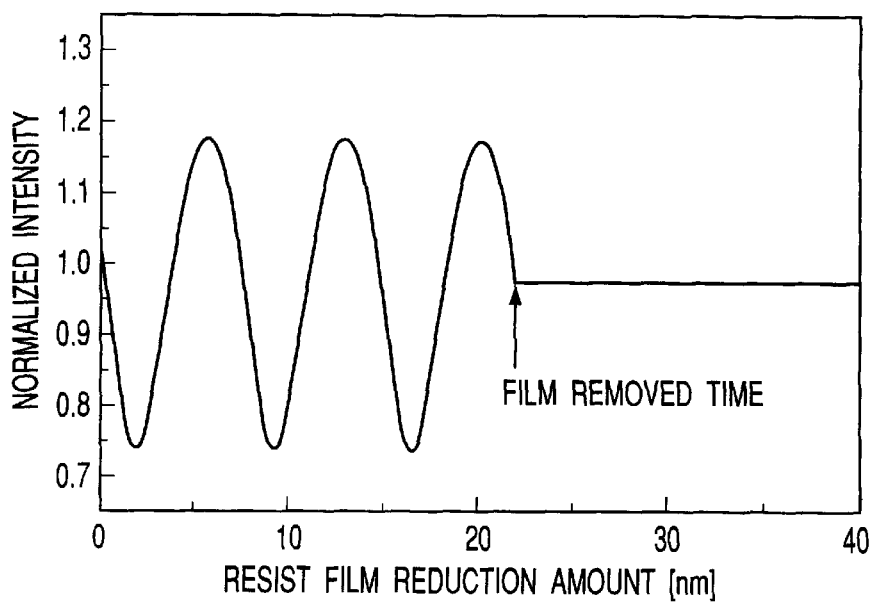
FIG. 58 is a graph illustrating variations in the reflected light intensity of a monitor area during development.
Figures 59, 60:
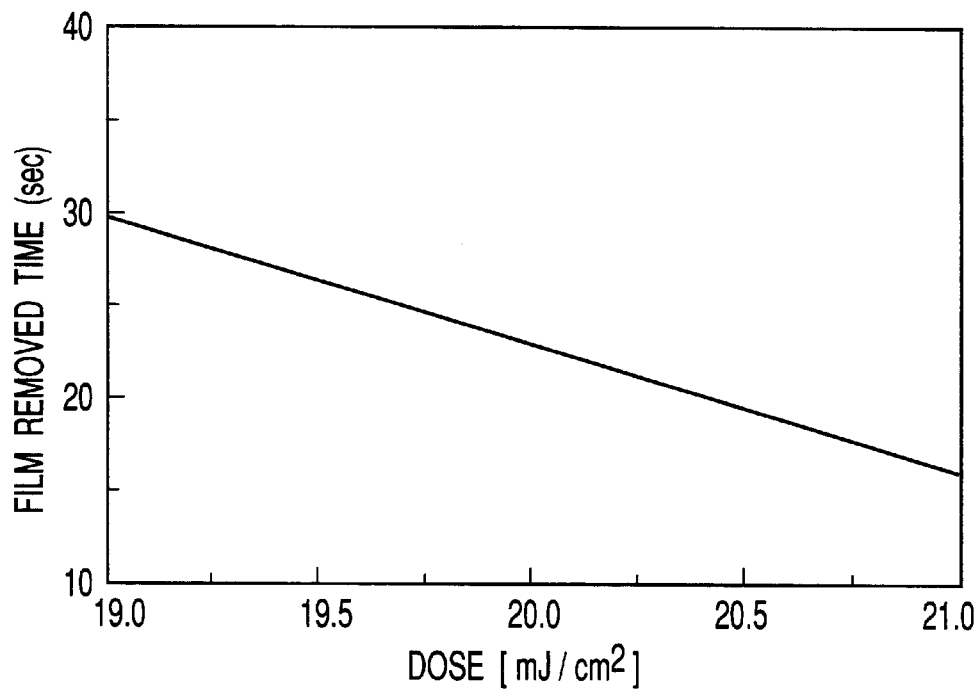
FIG. 59 is a graph showing the relationship between the exposure amount and the film removal period of a monitor area.
FIG. 60 is a view showing the measured film thicknesses of monitor areas in which latent images are formed.

The pattern with the transmittance of 46.9% used for monitoring a latent image has variations in normalized reflected light intensity as shown in FIG. 58 (wavelength: 420 nm). Since this pattern was exposed at a constant exposure amount, its film thickness is reduced while its normalized reflected light intensity shows an interference waveform. When the resist film thickness has come to 0, no change occurs in reflected light intensity. The period required until the reflected light intensity shows no change is referred to as a "film removal period". The relationship between the exposure amount and the film removal period is shown in FIG. 59. As is understood from this figure, the exposure amount is proportional to the film removal period. Accordingly, the exposure amount can be determined by measuring the film removal period. The reason why a wavelength of 420 nm is used for monitoring in FIG. 58 is that where the resist film thickness is 0 is to be used as the inflection point of the reflected light intensity.

This wavelength enables accurate determination of the film removal period, and makes the resist pattern almost free from the influence of slight variations in the underlayer thickness. Further, the value of focus can also be determined by determining the exposure amount from the removal period of a pattern having a particular transmittance, and using the relationship shown in FIG. 57 as well as the removal period of the L/S pattern with the width of 200 nm. Accordingly, the pattern size can be finished to a desired value by determining an optimal developing period for a focus value and an exposure amount that are given in advance. However, the degree of deviation of focus may differ between chips. In light of this, development may be executed for a developing period corresponding to an exposure amount, which is determined from the removal period of a pattern with a particular transmittance.

(Operation)

Figure 22:
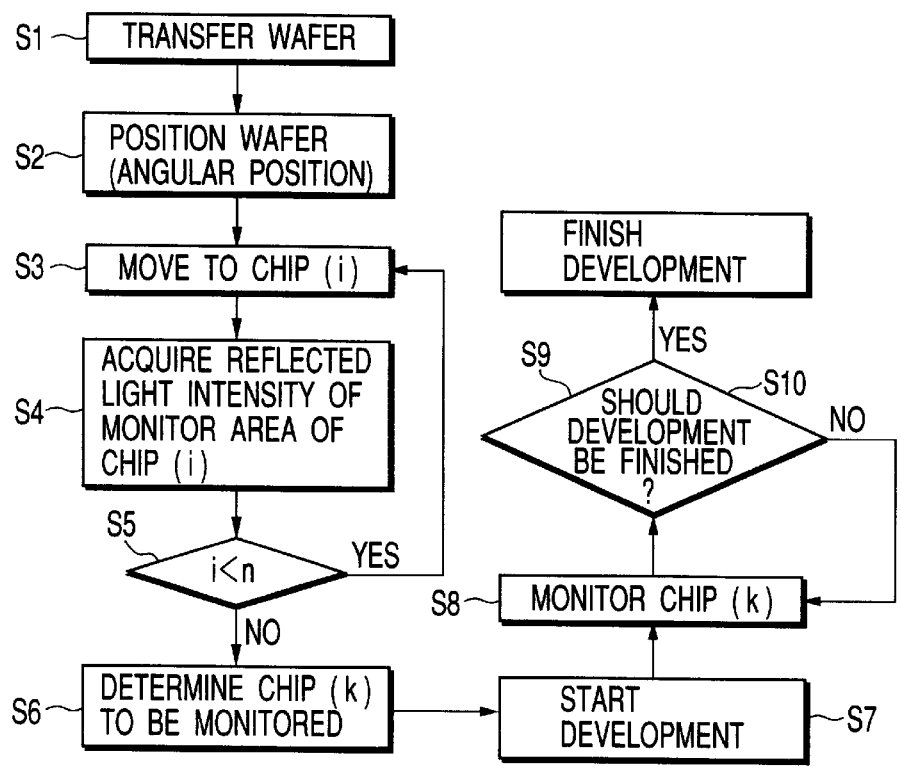
FIG. 22 is a flowchart illustrating a sequence of determination of a monitor chip and a sequence of development.

The sequence of development employed in this embodiment is similar to that of the sixth embodiment shown in FIG. 22. As mentioned in the section of structure, the seventh embodiment differs from the sixth embodiment in film thickness measuring method and development finish time determining method.

The sequence of development will be described using the actual experiment results.

The shot map of a wafer and the scanning order of nine chips to be monitored before development are similar to those shown in FIG. 23 as in the sixth embodiment. For each of the chips, the monitor head moves to a position in which the monitor area can be included in the screen of the head, thereby detecting the monitor area by pattern matching, and measuring the thickness of the resist film in which a latent image is formed. FIG. 60 shows the thicknesses of the latent-image-formed resist films of the nine chips, which were actually measured using a wavelength of 550 nm. The average film thickness is 11.4 nm, and hence the chip to be monitored during development was determined to be chip 1.

A method for determining an optimal developing period by monitoring the monitor area of chip 1 will be described.

As shown in FIGS. 57 and 59, the removal periods of the L/S pattern with the width of 200 nm and the pattern with the particular transmittance, which are monitored during development, are fifteen seconds or less and twenty–thirty seconds, respectively. In light of this, to measure the respective film removal periods, a wavelength of 550 nm is used until fifteen seconds elapse, and a wavelength of 420 nm is used after fifteen seconds elapse. In the actual measurements, the removal periods of the L/S pattern and the other pattern were ten seconds and twenty-one seconds, respectively, the exposure amount was 20.5 mJ/cm$^2$, and the focus was 0 μm. From the relationship shown in FIG. 56, development was finished after fifty-three seconds.

(Advantage)

To reduce variations in size between wafers, that one of the chips on each wafer, which has been processed under typical conditions, is extracted before the time of executing developing period control by measuring the film thicknesses of the monitor areas of the chips. After development is started, an exposure amount and a focus value are measured from the special point of variations in the reflected light intensity of the monitor area of the chip, which does not depend upon the thickness of the underlayer. Optimal development is executed on the basis of the measured values, thereby significantly reducing variations in size between wafers. This leads to a great increase in the yield of the products.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern estimating method for estimating a size of a device pattern which is formed by exposing a resist film on a to-be-processed substrate by a mask including a device pattern image, developing the device pattern, and estimating the size of the device pattern, comprising the steps of:

designing a monitor pattern by cutting part of the device pattern, by designing an element area using the cut part or partially changing the size of the cut part, and by repeatedly arranging the element area to form the monitor pattern;

exposing the resist film by the mask including both the device pattern and the monitor pattern;

detecting the intensity of diffracted light which is reflected from the developed monitor pattern when light of a predetermined wavelength has been applied to the developed monitor pattern, after the exposed resist film is developed; and estimating the size of the developed device pattern according to the intensity of the detected diffracted light on the basis of a predetermined relationship between a diffracted light intensity and a device pattern size.

2. A method according to claim 1, wherein the element area is cut such that the monitor pattern contains, per a unit area, a greater number of portions to be subjected to size estimation, than the device pattern.

3. A method according to claim 1, wherein when the device pattern is a line-type pattern, the monitor pattern includes a line-type pattern which has substantially the same pitch as the device pattern and has a larger size of resist-removed portions than the device pattern, or the monitor pattern includes a line-type pattern which has a smaller pitch than the device pattern and has substantially the same size of resist-removed portions as the device pattern.

4. A method according to claim 1, wherein when the device pattern is a line-type pattern, the monitor pattern includes a regular line-type pattern which has substantially the same pitch as the device pattern and has substantially the same size of resist-removed portions as the device pattern.

5. A method according to claim 1, wherein when the device pattern is a hole-type pattern, the monitor pattern includes a hole-type pattern which has a smaller ratio of a resist remaining area than the devise pattern.

6. A method according to claim 1, wherein when the device pattern is a hole-type pattern, the monitor pattern includes a hole-type pattern which has the same pitch as the device pattern and has a larger hole diameter than the device pattern, or the monitor pattern includes a hole-type pattern which has a smaller pitch than the device pattern and has substantially the same hole diameter as the device pattern.

7. A method according to claim 1, wherein the monitor pattern is included in a device area in which the device pattern is formed.

8. A method according to claim 1, wherein light to be applied to the monitor pattern has a wavelength which satisfies conditions for preventing occurrence of diffracted light of first-order or more reflected from the monitor pattern, the conditions being expressed by $$|\sin(\theta_i) - (\lambda/P)| > 1$$

where $\lambda$ represents the wavelength, $\theta_i$ represents the angle of incident light, and P represents the pitch of the monitor pattern.

9. A method according to claim 2, wherein the device pattern is formed of a plurality of line-type patterns, and when the plurality of line-type patterns are regularly arranged in line in an X direction such that they are separated from each other, and the plurality of line-type patterns are regularly arranged parallel to each other with a distance therebetween in a Y direction perpendicular to the X direction, the element area is a rectangular area defined by two X-directional line segments which pass respective central portions of two line-type patterns adjacent to each other in the Y direction and the rectangular area being also defined by two Y-directional line segments which do not include X-directional ends of the two line-type patterns.

10. A method according to claim 2, wherein the device pattern is formed of a plurality of line-type patterns, and when the plurality of line-type patterns are arranged in line in an X direction such that they are separated from each other, and the plurality of line-type patterns are arranged parallel to each other with a distance therebetween in a Y direction perpendicular to the X direction, the element area is a rectangular area defined by two X-directional line segments which pass respective central portions of two line-type patterns, and also defined by two Y-directional line segments which at least extend between the two line-type patterns, the rectangular area including end portions of line-type patterns adjacent to each other in the X direction.

11. A method according to claim 1, wherein when the device pattern is a line-type pattern or a hole-type pattern, the element area is cut such that the monitor pattern contains, per a unit area, a greater number of portions to be subjected to size estimation, than the device pattern.

12. A pattern forming method for forming a device pattern by exposing a resist film on a to-be-processed substrate by a mask including a device pattern, developing the exposed resist film for a certain period, and forming a device pattern, comprising the steps of:

designing a monitor pattern by cutting part of the device pattern, by designing an element area using the cut part area or partially changing the size of the cut part, and by repeatedly arranging the element area to form the monitor pattern;

exposing the resist film by the mask including both the device pattern and the monitor pattern;

detecting the intensity of diffracted light which is reflected from the developing monitor pattern when light of a predetermined wavelength has been applied to the developing monitor pattern, while exposed the resist film is developing;

estimating the size of the developing device pattern according to the intensity of the detected diffracted light on the basis of a predetermined relationship between a diffracted light intensity and a device pattern size; and stopping development when the estimated size of the device pattern has reached a desired value.

13. A method according to claim 12, wherein when the device pattern is a line-type pattern, the monitor pattern includes a line-type pattern which has substantially the same pitch as the device pattern and has a larger size of resist-removed portions than the device pattern, or the monitor pattern includes a line-type pattern which has a smaller pitch than the device pattern and has substantially the same size of resist-removed portions as the device pattern.

14. A method according to claim 12, wherein when the device pattern is a line-type pattern, the monitor pattern includes a regular line-type pattern which has substantially the same pitch as the device pattern and has substantially the same size of resist-removed portions as the device pattern.

15. A method according to claim 12, wherein when the device pattern is a hole-type pattern, the monitor pattern includes a hole-type pattern which has a smaller ratio of a resist remaining area than the device pattern.

16. A method according to claim 12, wherein when the device pattern is a hole-type pattern, the monitor pattern includes a hole-type pattern which has the same pitch as the device pattern and has a larger hole diameter than the device pattern, or the monitor pattern includes a hole-type pattern which has a smaller pitch than the device pattern and has substantially the same hole diameter as the device pattern.

17. A method according to claim 12, wherein the monitor pattern is included in a device area in which the device pattern is formed.

18. A method according to claim 12, wherein light to be applied to the monitor pattern has a wavelength which satisfies conditions for preventing occurrence of diffracted light of first-order or more reflected from the monitor pattern, the conditions being expressed by $$|\sin(\theta_i) - (\lambda/P)| > 1$$

where $\lambda$ represents the wavelength, $\theta_i$ represents the angle of incident light, and P represents the pitch of the monitor pattern.

19. A method according to claim 12, wherein in the step of stopping development, a development interrupting time is determined by comparing a corrected diffracted-light intensity at a present time point obtained on the basis of an approximate expression concerning variations in diffracted light intensity which have occurred from a predetermined time point of development to the present time point, with the intensity of zero-order light that enables formation of the device pattern into a desired size, or with a predetermined diffracted light intensity.

20. A pattern forming method for forming a device pattern by exposing a plurality of chip areas of a resist film on a to-be-processed substrate by the mask including a device pattern, heating and developing them to form a device pattern in each of the chip areas, comprising the steps of:

exposing each of the chip areas of the resist film on the to-be-processed substrate to form a latent image monitor area, a development monitor area, and the device pattern in said each chip area;

measuring the intensity of light of a predetermined wavelength which is reflected from the latent image monitor area in said each chip area when the light is applied to the latent image monitor area between the heating process after exposure and the development process;

extracting that one of the chip areas on the to-be-processed substrate, which has been processed under typical conditions, on the basis of the measurement results; and stopping development on the basis of a change in the intensity of light of a predetermined wavelength which is reflected from the development monitor area in the extracted chip area when the light has been applied to the development monitor area during development for forming the device patterns.

* * * * *

UNITED STATES PATENT AND TRADEMARK OFFICE
CERTIFICATE OF CORRECTION

PATENT NO.   : 6,187,488 B1
DATED        : February 13, 2001
INVENTOR(S)  : Kei Hayasaki et al.

It is certified that error appears in the above-identified patent and that said Letters Patent is hereby corrected as shown below:

<u>Column 28, claim 5,</u>
Line 56, "devise" should read -- device --.

Signed and Sealed this

Second Day of April, 2002

*Attest:*

*Attesting Officer*

JAMES E. ROGAN
*Director of the United States Patent and Trademark Office*